United States Patent
Lin et al.

(10) Patent No.: US 10,741,469 B2
(45) Date of Patent: Aug. 11, 2020

(54) THERMAL VIA ARRANGEMENT FOR MULTI-CHANNEL SEMICONDUCTOR DEVICE

(71) Applicant: MEDIATEK INC., Hsin-Chu (TW)

(72) Inventors: Hsien-Hsin Lin, Hsinchu (TW); Ming-Tzong Yang, Baoshan Township, Hsinchu County (TW); Wen-Kai Wan, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 66 days.

(21) Appl. No.: 15/800,611

(22) Filed: Nov. 1, 2017

(65) Prior Publication Data
US 2018/0138104 A1 May 17, 2018

Related U.S. Application Data
(60) Provisional application No. 62/421,409, filed on Nov. 14, 2016.

(51) Int. Cl.
| | | |
|---|---|---|
| H01L 23/367 | (2006.01) | |
| H01L 23/528 | (2006.01) | |
| H01L 23/535 | (2006.01) | |
| H01L 29/78 | (2006.01) | |
| H01L 29/417 | (2006.01) | |
| H01L 27/02 | (2006.01) | |

(52) U.S. Cl.
CPC .......... H01L 23/367 (2013.01); H01L 23/528 (2013.01); H01L 23/535 (2013.01); H01L 27/0211 (2013.01); H01L 29/41791 (2013.01); H01L 29/785 (2013.01); H01L 29/7851 (2013.01)

(58) Field of Classification Search
None
See application file for complete search history.

(56) References Cited

U.S. PATENT DOCUMENTS

| | | | | |
|---|---|---|---|---|
| 7,339,241 | B2 * | 3/2008 | Orlowski | H01L 29/41733 257/401 |
| 7,345,346 | B2 * | 3/2008 | Hoshizaki | H01L 29/41733 257/368 |
| 9,000,489 | B2 * | 4/2015 | Lu | H01L 29/785 257/202 |
| 9,590,057 | B2 * | 3/2017 | Leobandung | H01L 29/41791 |
| 9,620,602 | B2 * | 4/2017 | Watanabe | H05K 999/99 |

(Continued)

*Primary Examiner* — David E Graybill
(74) *Attorney, Agent, or Firm* — McClure, Qualey & Rodack, LLP

(57) ABSTRACT

The invention provides a semiconductor device. The semiconductor device includes a gate structure over fin structures arranged in parallel. Each of the fin structures has a drain portion and a source portion on opposite sides of the gate structure. A drain contact structure is positioned over the drain portions of the fin structures. A source contact structure is positioned over the source portions of the fin structures. A first amount of drain via structures is electrically connected to the drain contact structure. A second amount of source via structures is electrically connected to the source contact structure. The sum of the first amount and the second amount is greater than or equal to 2, and the sum of the first amount and the second amount is less than or equal to two times the amount of fin structures.

18 Claims, 21 Drawing Sheets

(56) References Cited

U.S. PATENT DOCUMENTS

| | | | |
|---|---|---|---|
| 2007/0045735 A1* | 3/2007 | Orlowski | H01L 29/41733 257/347 |
| 2007/0108535 A1* | 5/2007 | Hoshizaki | H01L 29/41733 257/382 |
| 2008/0283925 A1* | 11/2008 | Berthold | H01L 21/845 257/368 |
| 2014/0117453 A1* | 5/2014 | Lu | H01L 29/41791 257/365 |
| 2015/0287796 A1* | 10/2015 | Leobandung | H01L 29/41791 257/386 |
| 2016/0043222 A1* | 2/2016 | Cho | H01L 29/7845 257/369 |
| 2016/0056154 A1* | 2/2016 | Watanabe | H05K 999/99 257/401 |
| 2018/0138104 A1* | 5/2018 | Lin | H01L 29/41791 |

* cited by examiner

THERMAL VIA ARRANGEMENT FOR MULTI-CHANNEL SEMICONDUCTOR DEVICE

CROSS REFERENCE TO RELATED APPLICATIONS

This application claims the benefit of U.S. Provisional Application No. 62/421,409 filed Nov. 14, 2016, the entirety of which is incorporated by reference herein.

BACKGROUND OF THE INVENTION

Field of the Invention

The present invention relates to a semiconductor device, and in particular to a thermal via arrangement for a multi-channel semiconductor device.

Description of the Related Art

The design of integrated circuits requires a shrinkage channel length for an electronic device and an increased number of input/output connections (pin account) for multi-functional cells. Accordingly, fin-like electronic devices have been developed for the increase of pin accesses for the cells. For a conventional integrated circuit, however, the reliability and quality of fin-like electronic devices is limited due to problems with heat dissipation.

Thus, a novel semiconductor device having improved thermal dissipation ability is needed.

BRIEF SUMMARY OF THE INVENTION

A semiconductor device is provided. An exemplary embodiment of a semiconductor device includes a gate structure over fin structures arranged in parallel. Each of the fin structures has a drain portion and a source portion on opposite sides of the gate structure. A drain contact structure is positioned over the drain portions of the fin structures. A source contact structure is positioned over the source portions of the fin structures. A first amount of drain via structures is electrically connected to the drain contact structure. A second amount of source via structures is electrically connected to the source contact structure. The sum of the first amount and the second amount is greater than or equal to 2, and the sum of the first amount and the second amount is less than or equal to two times the amount of fin structures.

Another exemplary embodiment of a semiconductor device includes a gate structure over fin structures arranged in parallel. Each of the fin structures has a drain portion and a source portion. A drain contact structure is positioned over the drain portions of the fin structures. A source contact structure is positioned over the source portions of the fin structures. A drain via structure is electrically connected to the drain contact structure. A source via structure is electrically connected to the source contact structure. A first amount of drain dummy via structures is electrically connected to the drain contact structure and beside the drain via structure. A second amount of source dummy via structures is electrically connected to the source contact structure and beside the source via structure. The first amount and/or the second amount is less than the amount of fin structures.

Yet another exemplary embodiment of a semiconductor device includes a gate structure over fin structures arranged in parallel. Each of the fin structures has a drain portion and a source portion on opposite sides of the gate structure. A single drain contact structure is positioned over the drain portions of the fin structures. A single source contact structure is positioned over the source portions of the fin structures. A first amount of drain via structures is in contact with the single drain contact structure. A second amount of source via structures is in contact with the single source contact structure. A first overlapping area between the first amount of drain via structures and the drain contact structure is less than or equal to a second overlapping area between the second amount of source via structures and the source contact structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
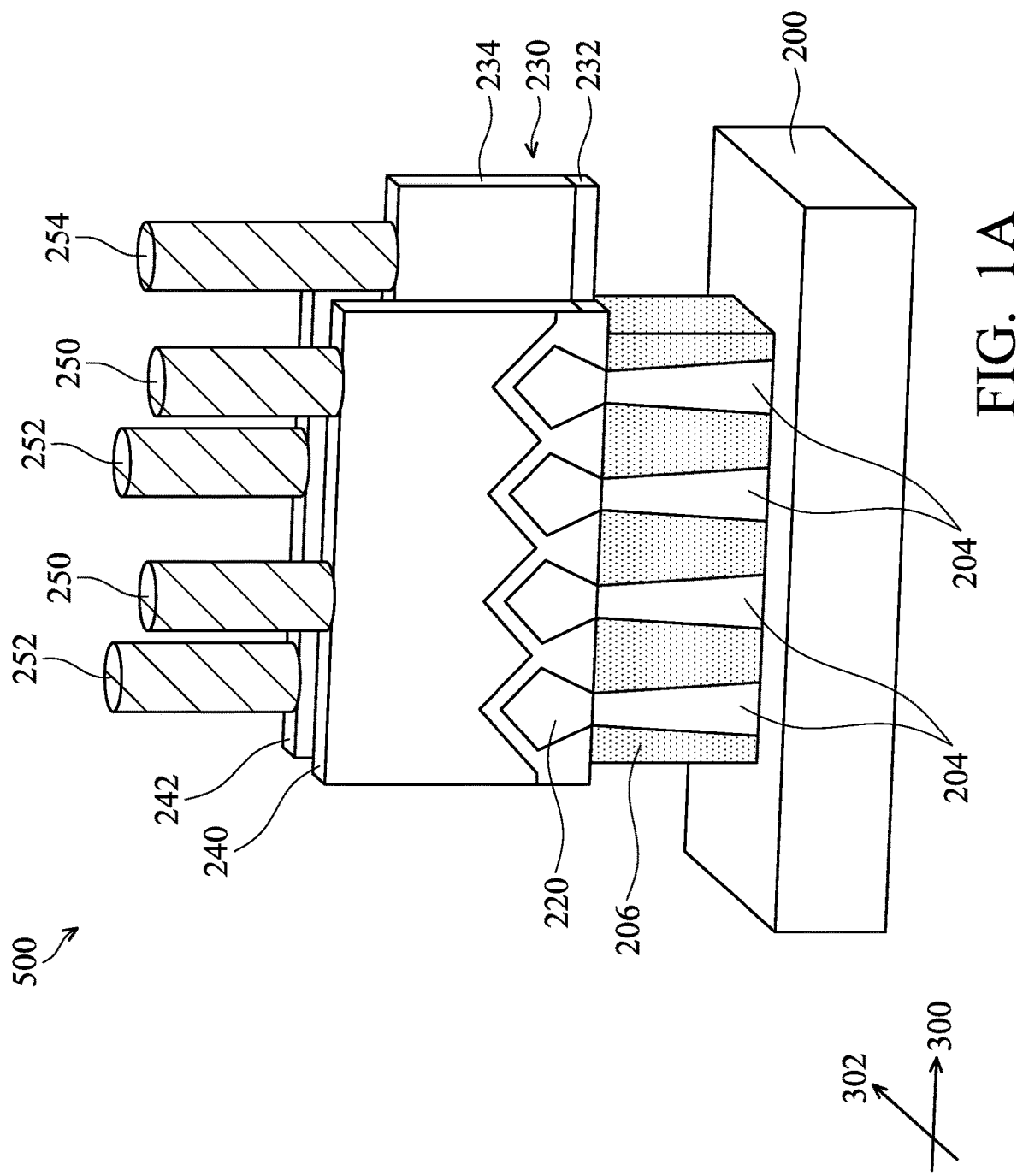
FIG. 1A is a perspective view of an semiconductor device in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments provide a semiconductor device. The semiconductor device includes fin-liked electronic devices connected in parallel, so that the semiconductor device may serve as a multi-channel fin-liked electronic device. The semiconductor device provides a rule of the arrangement of additional bottommost via structures on a single source contact structure and/or a single drain contact structure of the multi-channel fin-liked electronic device to improve the thermal dissipation ability.

Figure 1B:
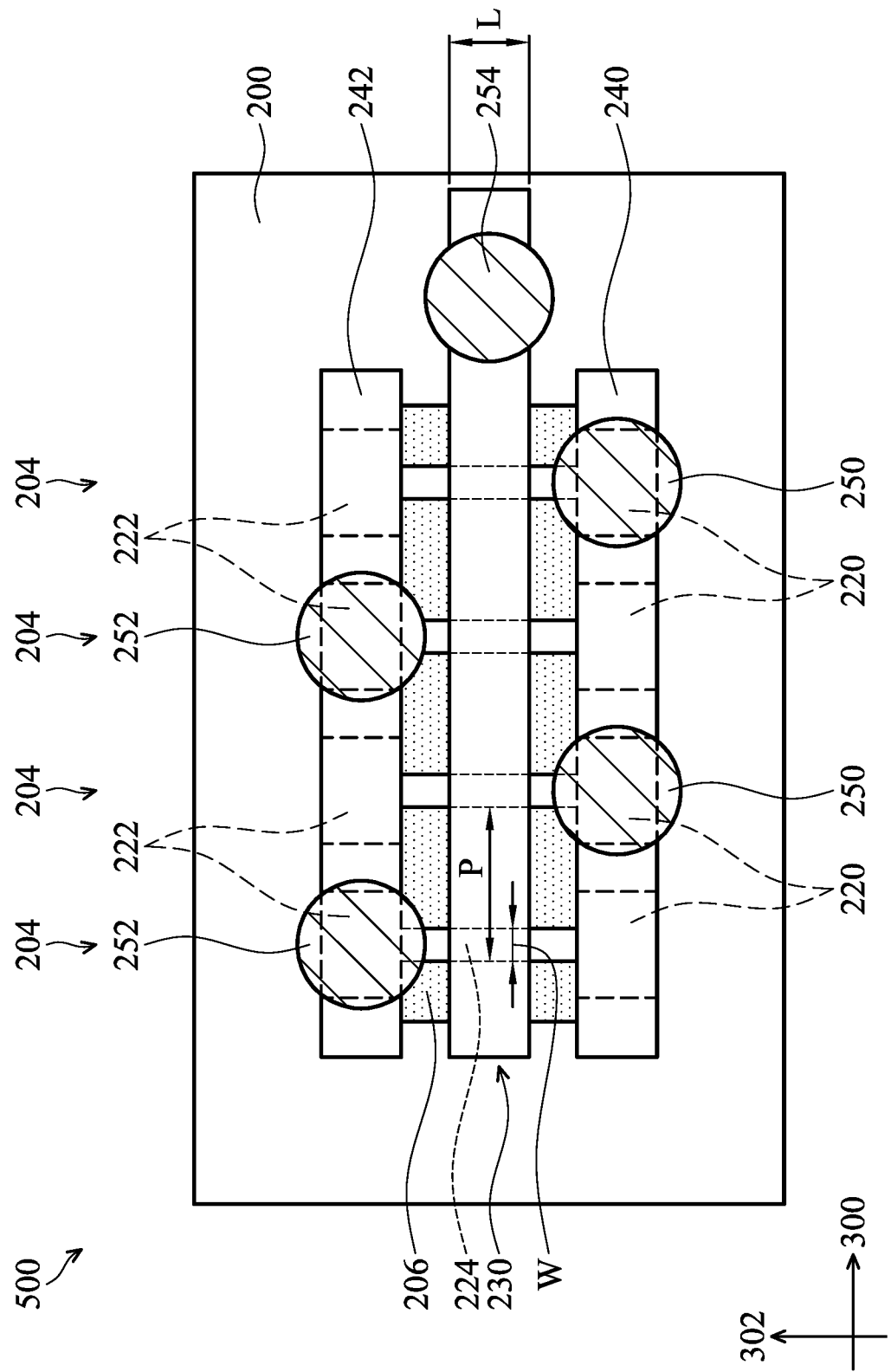
FIG. 1B is a top view of an semiconductor device in accordance with some embodiments of the disclosure shown in FIG. 1A.

FIG. 1A is a perspective view of a semiconductor device 500 in accordance with some embodiments of the disclosure. FIG. 1B is a top view of the semiconductor device 500 in accordance with some embodiments of the disclosure shown in FIG. 1A. In some embodiments, the semiconductor device 500 includes a multi-channel fin field-effect transistor (multi-channel fin FET). As shown in FIGS. 1A and 1B, the semiconductor device 500 includes a substrate 200 including a plurality of fin structures 204, a gate structure 230, a drain contact structure 240, a source contact structure 242, drain via structures 250 and source via structures 252.

In some embodiments, the substrate 200 includes a silicon (Si) substrate or a SiGe substrate. In some embodiments, the substrate 200 includes a bulk semiconductor substrate, a strained semiconductor substrate or a compound semiconductor substrate. In some embodiments, the substrate is a silicon on insulator (SOI) layer substrate or a silicon on sapphire (SOS) substrate.

As shown in FIGS. 1A and 1B, the fin structures 204 extend from the substrate 200. In some embodiments, each of the fin structures 204 is defined and surrounded by trench isolation features 206 extending substantially along a direction 302. Therefore, the fins 204 are arranged in parallel and extended substantially along the direction 302. In addition, the fin structures 204 are periodically arranged with a pitch P in a direction 300 that is different from the direction 302. In some embodiments, the direction 302 is not parallel to the direction 300. For example, the direction 302 is substantially perpendicular to the direction 300. In some embodiments, the trench isolation features 206 include shallow trench isolation (STI) features, field oxide (FOX) features, or other suitable electrically insulating features.

As shown in FIGS. 1A and 1B, in some embodiments, each of the fin structures 204 has a source portion 222, a drain portion 220, and a channel portion 224. In some embodiments, the source portion 222 and the drain portion 220 are arranged close to terminals of each of the fin structures 204, respectively. In some embodiments, as shown in FIGS. 1A and 1B, four fin structures 204 are shown for clarity, but the amount of fin structures 204 is not limited to the disclosed embodiments. In other embodiments, the amount of fin structures 204 is set to meet the design requirements.

As shown in FIGS. 1A and 1B, in some embodiments, the gate structure 230 is formed on the tops and opposite sidewalls of each of the fin structures 204. In addition, the gate structure 230 may include a single gate structure extending substantially along the direction 300. In some embodiments, the gate structure 230 includes a gate dielectric layer 232 and a gate electrode layer 234 over the gate dielectric layer 232. In some embodiments, the gate dielectric layer 232 is formed of a high-k dielectric layer. The high-k dielectric layer may be formed of hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate electrode layer 234 is formed of a conductive material, such as aluminum (Al), copper (Cu), tungsten (W), titanium (Ti), tantalum (Ta), or another applicable material.

In some embodiments, a portion of each of the fin structures 204 overlapping the gate structure 230 is defined as a channel portion 224 of each of the fin structures 204. The channel portion 224 may be positioned in the middle portion of each of the fin structures 204 and between the source portion 222 and the drain portion 220. In addition, the source portion 222 and the drain portion 220 are positioned on opposite sides of the gate structure 230. In some embodiments, the channel portion 224 has a length L substantially along the direction 302 and a width W substantially along the direction 300. The length L is defined as a channel length of the semiconductor device 500. In some embodiments, the channel length of the semiconductor device 500 is designed to be equal to or less than 20 nm, for example, 20 nm, 16 nm, 14 nm or 10 nm. In addition, a channel width of the semiconductor device 500 is defined by multiplying the width W of the channel portion 224 by the amount of fin structures 204. For example, the channel width of the semiconductor device 500 is 4 W. However, the amount of fin structures 204 shown in FIGS. 1A and 1B is not limited to the disclosed embodiments.

As shown in FIGS. 1A and 1B, in some embodiments, the drain contact structure 240 is positioned over the drain portions 220 of the fin structures 204 and the trench isolation features 206 between the fin structures 204. The drain contact structure 240 may be formed extending substantially along the direction 300. In addition, the drain contact structure 240 may be a single conductive structure, which is formed directly above and is electrically connected to the drain portions 220 of the fin structures 204. That is to say, the drain portions 220 of the fin structures 204 of the semiconductor device 500 are electrically connected to each other through the single drain contact structure 240. In some embodiments, the drain contact structure 240 is formed of conductive materials, such as copper (Cu), aluminum (Al), tungsten (W), titanium (Ti), titanium nitride (TiN), tantalum (Ta), tantalum nitride (TaN), or another applicable material.

As shown in FIGS. 1A and 1B, in some embodiments, the source contact structure 242 is positioned over the source portions 222 of the fin structures 204 and the trench isolation features 206 between the fin structures 204. The source contact structure 242 may be formed extending substantially along the direction 300. In addition, the source contact structure 242 is a single conductive structure, which is formed directly above and is electrically connected to the source portions 202 of the fin structures 204. That is to say, the source portions 202 of the fin structures 204 of the semiconductor device 500 are electrically connected to each other through the single source contact structure 242. In some embodiments, the source contact structure 242 is formed of conductive materials, such as copper (Cu), aluminum (Al), tungsten (W), titanium (Ti), titanium nitride (TiN), tantalum (Ta), tantalum nitride (TaN), or another applicable material.

As shown in FIGS. 1A and 1B, in some embodiments, a first amount of drain via structures 250 is electrically connected to the drain contact structure 240. In addition, the drain via structures 250 are positioned on and in contact with the single drain contact structure 240. Therefore, the drain via structures 250 may serve as the bottommost via structures. In some embodiments, the drain via structures 250 are respectively positioned overlying the drain portions 220 of the fin structures 204. In some embodiments, the drain via structures 250 and the drain portions 220 of the fin structures 204 are in one-to-one correspondence. For example, each of the drain via structures 250 is positioned directly above a single drain portion 220 of the corresponding fin structure 204.

In some embodiments, as shown in FIGS. 1A and 1B, the amount of drain via structures 250 (the first amount) is designed to be less than or equal to the amount of fin structures 204 of the semiconductor device 500. For example, the amount of drain via structures 250 (the first amount) is two. That is to say, there are two drain via structures 250 that are arranged in the semiconductor device 500 having four fin structures 204. It should be noted that the amount of drain via structures 250 is not limited to the disclosed embodiments. In some embodiments, the amount of drain via structures 250 is to meet the requirement that the closest two drain via structures 250 are separated from each other by at least two times the pitch P of the fin structures 204. For example, the two drain via structures 250 are respectively arranged directly above the drain portion 220 of the second fin structure 204 and the drain portion 220 of the fourth fin structure 204 from the left of the FIG. 1B.

In some embodiments, the drain via structures 250 are formed of a conductive material, such as copper (Cu), aluminum (Al), tungsten (W), titanium (Ti), titanium nitride (TiN), tantalum (Ta), tantalum nitride (TaN), or another applicable material.

As shown in FIGS. 1A and 1B, in some embodiments, a second amount of source via structures 252 is electrically connected to the source contact structure 242. In addition, the source via structures 252 are positioned on and in contact with the single source contact structure 242. Therefore, the source via structures 252 may serve as the bottommost via structures. In some embodiments, the source via structures 252 are respectively positioned overlying the source portions 222 of the fin structures 204. In some embodiments, the source via structures 252 and the source portions 222 of the fin structures 204 are in one-to-one correspondence. For example, each of the source via structures 252 is positioned directly above a single source portion 222 of the corresponding fin structure 204.

In some embodiments, as shown in FIGS. 1A and 1B, the amount of source via structures 252 (the second amount) is designed to be less than or equal to the amount of fin structures 204 of the semiconductor device 500. For example, the amount of source via structures 252 (the second amount) is two. That is to say, there are two source via structures 252 arranged in the semiconductor device 500 having four fin structures 204. It should be noted that the amount of source via structures 252 is not limited to the disclosed embodiments. In some embodiments, the amount of source via structures 252 is to meet the requirement that the closest two source via structures 252 are separated from each other by at least two times the pitch P of the fin structures 204. For example, the two source via structures 250 are respectively arranged directly above the source portion 222 of the first fin structure 204 and the source portion 222 of the third fin structure 204 from the left of the FIG. 1B.

In some embodiments, the source via structures 252 are formed of a conductive material, such as copper (Cu), aluminum (Al), tungsten (W), titanium (Ti), titanium nitride (TiN), tantalum (Ta), tantalum nitride (TaN), or another applicable material.

In some embodiments, the semiconductor device 500 is designed to have the following arrangements, the sum of the amount of drain via structures 250 and the source via structures 252 (the sum of the first amount and second amount) is greater than or equal to 2, and the sum of the amount of drain via structures 250 and the amount of source via structures 252 is less than or equal to two times the amount of fin structures 204 (2≤(the sum of the amount of drain via structures 250 and the source via structures 252)≤2*the amount of fin structures 204). For example shown in FIGS. 1A and 1B, the amount of drain via structures 250 is 2 (i.e. the first amount is 2), the amount of source via structures 252 is 2 (i.e. the second amount is 2), the amount of fin structures 204 is 4, and two times the amount of fin structures 204 is 8. Therefore, the sum of the amount of drain via structures 250 and the amount of source via structures 252, which is equal to 4, is greater than 2 and less than 8.

In some embodiments, the semiconductor device 500 is designed to have the following arrangements, the first amount of drain via structures 250 are respectively positioned overlying the drain portions 220 of the first amount of fin structures 204, and the second amount the source via structures 252 are respectively positioned overlying the source portions 222 of the second amount of remaining fin structures 204. For example shown in FIGS. 1A and 1B, two drain via structures 250 are respectively positioned overlying the drain portions 220 of two of the fin structures 204 (e.g. the drain portion 220 of the second fin structure 204 and the drain portion 220 of the fourth fin structure 204 from the left of the FIG. 1B), and two source via structures 252 are respectively positioned overlying the source portions 222 of the remaining two source via structures 252 are respectively positioned overlying the source portions 222 (e.g. the source portion 222 of the first fin structure 204 and the source portion 222 of the third fin structure 204 from the left of the FIG. 1B).

In some embodiments, the semiconductor device 500 is designed to arrange one of the drain via structures 250 directly above the drain portion 220 of one of the fin structures 204, and to arrange one of the source via structures 252 directly above the source portion 222 of another one of the fin structures 204. In addition, the remaining source via structures 252 are free from having to be positioned directly above the source portion 222 of the one of the fin structures 204, and the remaining drain via structures 250 are free from having to be positioned directly above the drain portion 220 of the other one of the fin structures 240. For example shown in FIGS. 1A and 1B, the leftmost one of the drain via structures 250 is arranged directly above the drain portion 220 of the second fin structures 204 from the left of the figures, and the leftmost one of the source via structures 252 is arranged directly above the source portion 222 of the first fin structures 204 from the left of the figures. In addition, the rightmost one of the source via structures 252 (the remaining source via structures 252) is free from having to be positioned directly above the source portion 222 of the second fin structures 204 from the left of the figures, and the rightmost one of the drain via structures 250 is free from having to be positioned directly above the drain portion 220 of the drain portion 220 of the first fin structures 204 from the left of the figures.

As shown in FIGS. 1A and 1B, in some embodiments, one or more gate via structures 254 is electrically connected to the gate structure 230. For example, one gate via structures 254 is arranged in the gate structure 230 of the semiconductor device 500. It should be noted that the amount of gate via structures 254 is not limited to the disclosed embodiments. In some embodiments, the amount of gate via structures 254 is set to be less than or equal the amount of drain via structures 250 and/or the amount of source via structures 252. In some other embodiments, the amount of gate via structures 254 is to meet the requirement that the closest two gate via structures 254 are separated from each other by at least two times the pitch P of the fin structures 204.

In some embodiments, the gate via structure 254 is positioned on and in contact with the single gate structure 230. In some embodiments, the gate via structure 254 is respectively positioned overlying the source portions 222 of the fin structures 204. In some embodiments, the gate via structure 254 are formed of a conductive material, such as copper (Cu), aluminum (Al), tungsten (W), titanium (Ti), titanium nitride (TiN), tantalum (Ta), tantalum nitride (TaN), or another applicable material.

In some embodiments, the semiconductor device 500, for example, a multi-channel FinFET device, is designed to have more than one drain via structure 250 and more than one source via structure 252 to improve the thermal dissipation ability of the multi-channel FinFET device.

FIGS. 2A-2D are top views of semiconductor devices 500A-500D in accordance with some embodiments of the disclosure. FIGS. 3A-3D are top views of semiconductor devices 600A-600D in accordance with some comparable examples. FIG. 4 is a diagram showing the simulation result of thermal resistance ($R_{th0}$) of the semiconductor devices 500A-500D shown in FIGS. 2A-2D and thermal resistance (Rth0) of the semiconductor devices 600A-600D shown in FIGS. 3A-3D. The simulation result is obtained based on the parameters of the semiconductor devices 500A-500D and 600A-600D, for example, CPP (the distance between the drain via structure/source via structure and the gate electrode layer (i.e. contact-gate pitch))=70 nm, Fin Pitch (the pitch (P) of the fin structure)=42 nm, Lg (the length (along the direction 302) of the gate electrode layer)=22 nm, Fin Height (the height of the fin structure)=40 nm, Fin Width (the width (along the direction 300) of the fin structure)=8 nm (top)/10 nm (bottom), and via diameter (the diameter of the drain via structure/source via structure)=32 nm. In addition, FIG. 4 illustrates the relationship between the thermal resistance ($R_{th0}$) of the semiconductor devices 500A-500D shown in FIGS. 2A-2D and the amount of fin structures, and the relationship between thermal resistance ($R_{th0}$) of the semiconductor devices 600A-600D shown in FIGS. 3A-3D and the amount of fin structures. Elements of the embodiments hereinafter, that are the same or similar as those previously described with reference to FIGS. 1A and 1B, are not repeated for brevity.

Figure 2A:
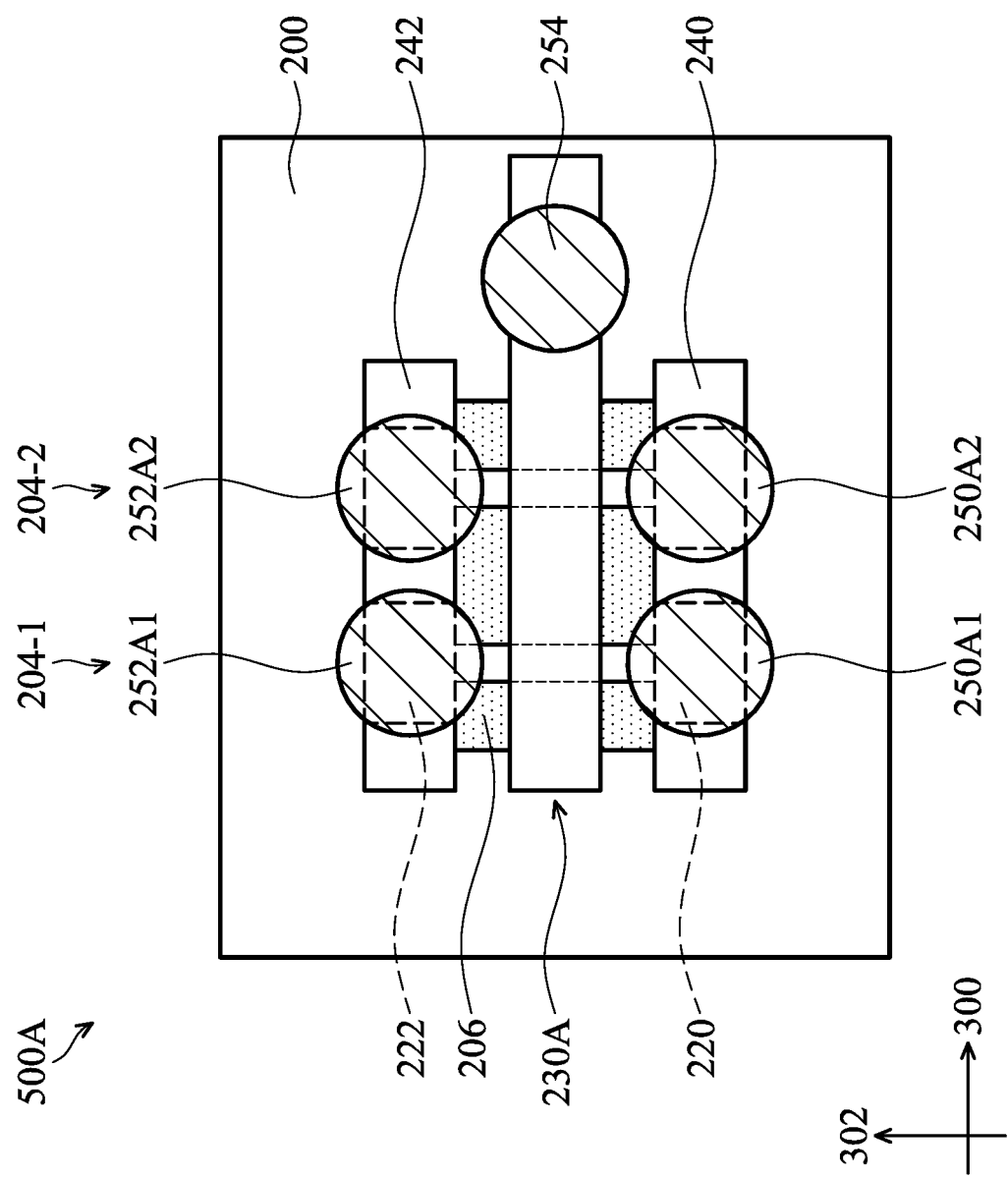
FIGS. 2A-2D are top views of an semiconductor device in accordance with some embodiments of the disclosure.

As shown in FIG. 2A, the semiconductor device 500A is a multi-channel FinFET device having two fin structures 204-1 and 204-2. The semiconductor device 500A includes two drain via structures 250A1 and 250A2 respectively on the drain portions 220 of the fin structures 204-1 and 204-2. The semiconductor device 500A includes two source via structures 252A1 and 252A2 respectively on the source portions 222 of the fin structures 204-1 and 204-2. In addition, the semiconductor device 500A includes one gate via structure 254 on a gate structure 230A.

Figure 2B:
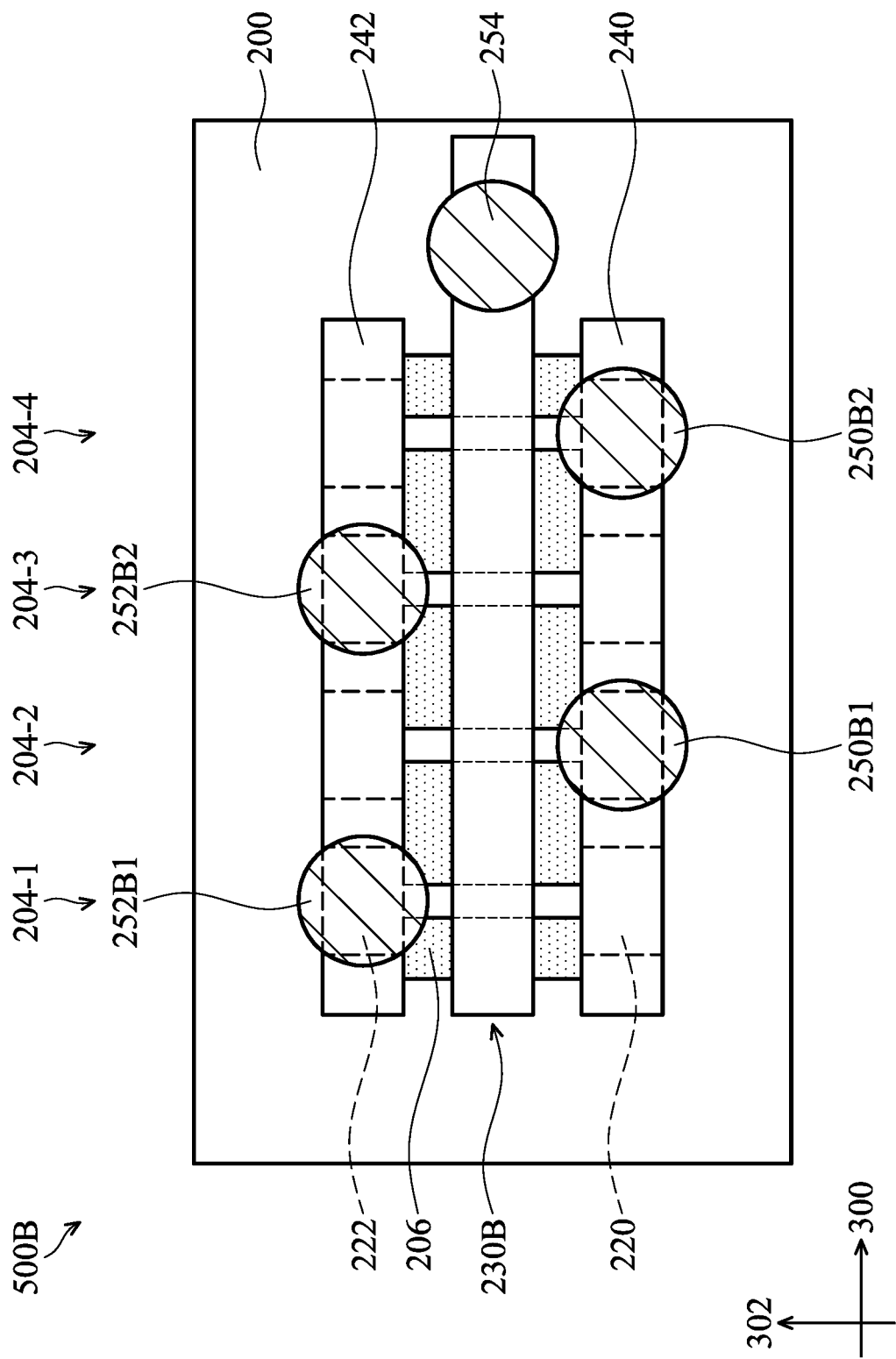

As shown in FIG. 2B, the semiconductor device 500B is similar to the semiconductor device 500 shown in FIG. 1B. The semiconductor device 500B is a multi-channel FinFET device having four fin structures 204-1, 204-2, 204-3 and 204-4. The semiconductor device 500B includes two drain via structures 250B1 and 250B2 respectively on the drain portions 220 of the fin structures 204-2 and 204-4. The semiconductor device 500B includes two source via structures 252B1 and 252B2 respectively on the source portions 222 of the fin structures 204-1 and 204-3. In addition, the semiconductor device 500B includes one gate via structure 254 on a gate structure 230B.

Figure 2C:
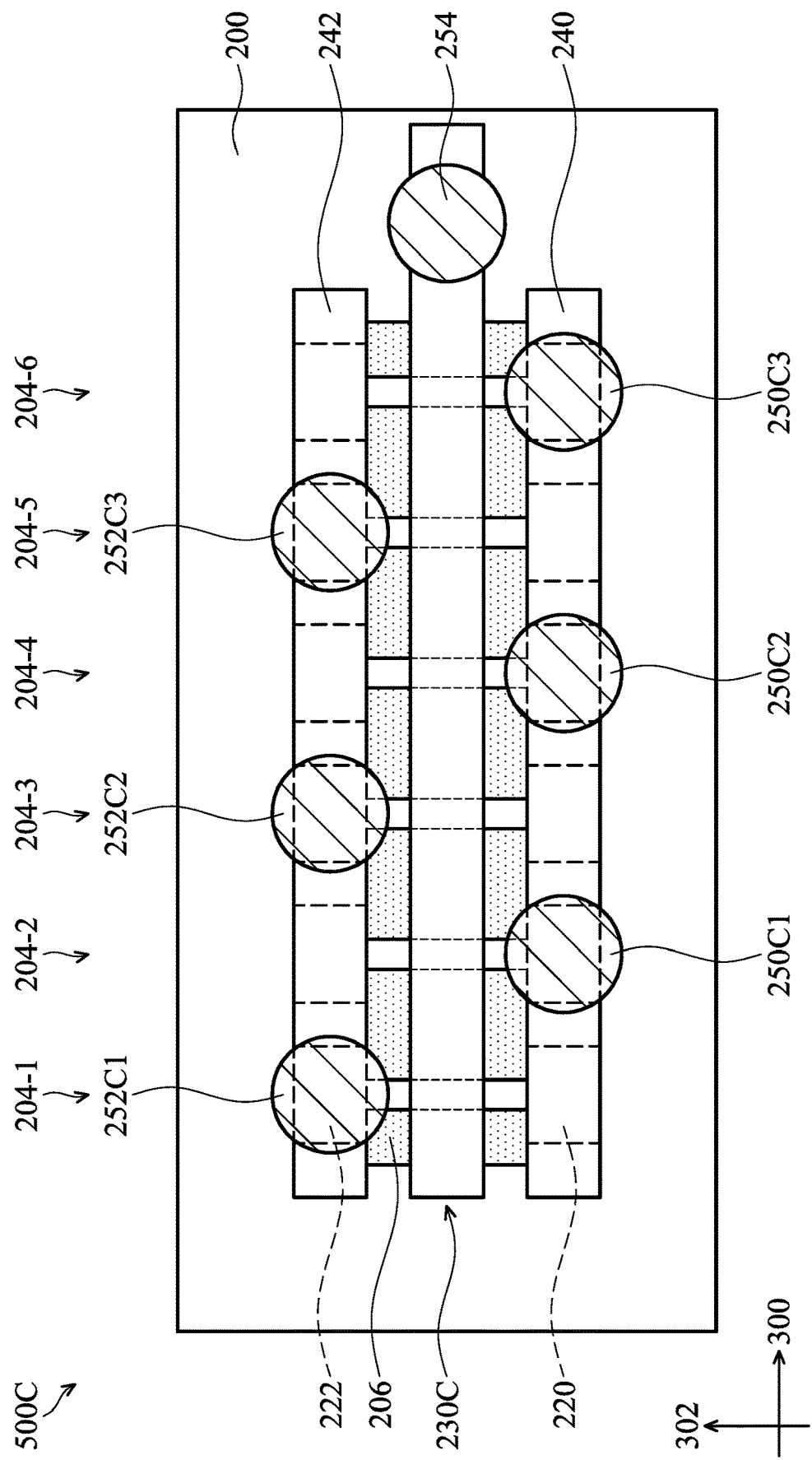

As shown in FIG. 2C, the semiconductor device 500C is a multi-channel FinFET device having six fin structures 204-1, 204-2, 204-3, 204-4, 204-5 and 204-6. The semiconductor device 500B includes three drain via structures 250C1, 250C2 and 250C3 respectively on the drain portions 220 of the fin structures 204-2, 204-4 and 204-6. The semiconductor device 500B includes three source via structures 252C1, 252C2 and 252C3 respectively on the source portions 222 of the fin structures 204-1, 204-3 and 204-5. In addition, the semiconductor device 500C includes one gate via structure 254 on a gate structure 230C.

Figure 2D:
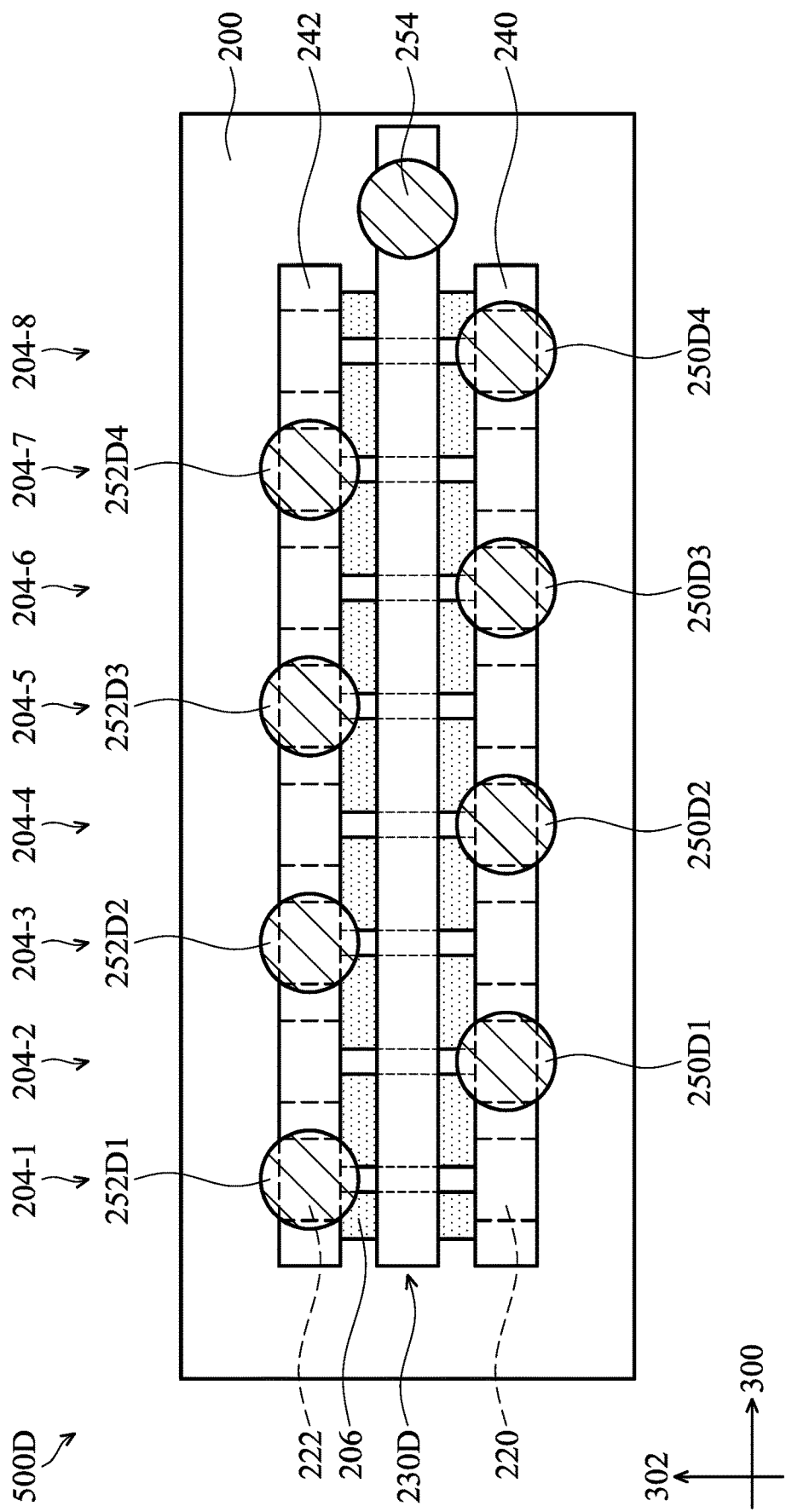

As shown in FIG. 2D, the semiconductor device 500D is a multi-channel FinFET device having eight fin structures 204-1, 204-2, 204-3, 204-4, 204-5, 204-6, 204-7 and 204-8. The semiconductor device 500D includes four drain via structures 250D1, 250D2, 250D3 and 250D4 respectively on the drain portions 220 of the fin structures 204-2, 204-4, 204-6 and 204-8. The semiconductor device 500D includes four source via structures 252D1, 252D2, 252D3 and 252D4 respectively on the source portions 222 of the fin structures 204-1, 204-3, 204-5 and 204-7. In addition, the semiconductor device 500D includes one gate via structure 254 on a gate structure 230D.

In some embodiments, the fin structures 204-1, 204-2, 204-3, 204-4, 204-5, 204-6, 204-7 and 204-8 of the semiconductor devices 500A-500D are the same as/similar to the fin structure 214 of the semiconductor device 500 shown in FIGS. 1A-1B. The drain via structures 250A1 and 250A2, the drain via structures 250B1 and 250B2, the drain via structures 250C1, 250C2 and 250C3 and the drain via structures 250D1, 250D2, 250D3 and 250D4 of the semiconductor devices 500A-500D are the same as/similar to the drain via structure 250 of the semiconductor devices 500 shown in FIGS. 1A-1B. The source via structures 252A1 and 252A2, the source via structures 252B1 and 252B2, the source via structures 252C1, 252C2 and 252C3 and the source via structures 252D1, 252D2, 252D3 and 252D4 of the semiconductor devices 500A-500D are the same as/similar to the source via structures 252 of the semiconductor devices 500 shown in FIGS. 1A-1B. The gate structures 230A-230D of the semiconductor devices 500A-500D are the same as/similar to the gate structure 230 of the semiconductor devices 500 shown in FIGS. 1A-1B.

In some embodiments, the semiconductor devices 500A-500D are designed to have the following arrangements, the sum of the amount of drain via structures and the source via structures is greater than or equal to 2, and the sum of the amount of drain via structures and the source via structures is less than or equal to two times the amount of fin structures.

In addition, the arrangements of the drain via structures and the source via structures of the semiconductor devices 500B-500D may set to meet the arrangements of the drain via structures and the source via structures of the semiconductor device 500.

FIGS. 3A-3D are top views of semiconductor devices 600A-600D in accordance with some comparable examples. Each of the semiconductor devices 600A-600D has a single drain via structure and a single source via structure. Compared with the semiconductor devices 500A-500D, the semiconductor devices 600A-600D have a similar structure except that each of the semiconductor devices 600A-600D has a single drain via structure on the single drain contact structure and a single source via structure 640 on the single source contact structure 642.

Figure 3A:
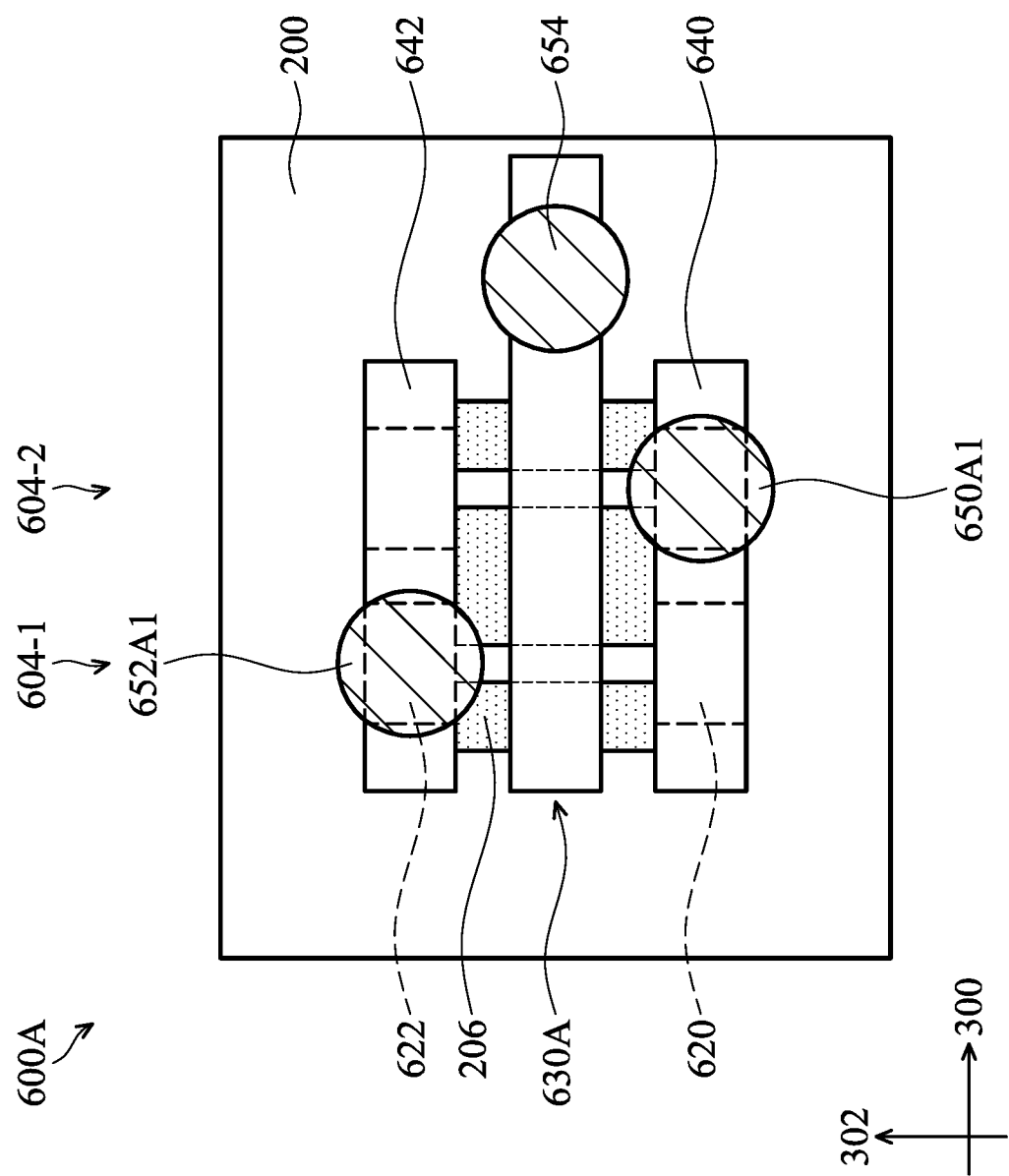
FIGS. 3A-3D are top views of an semiconductor device in accordance with some comparable examples.
Figure 4:
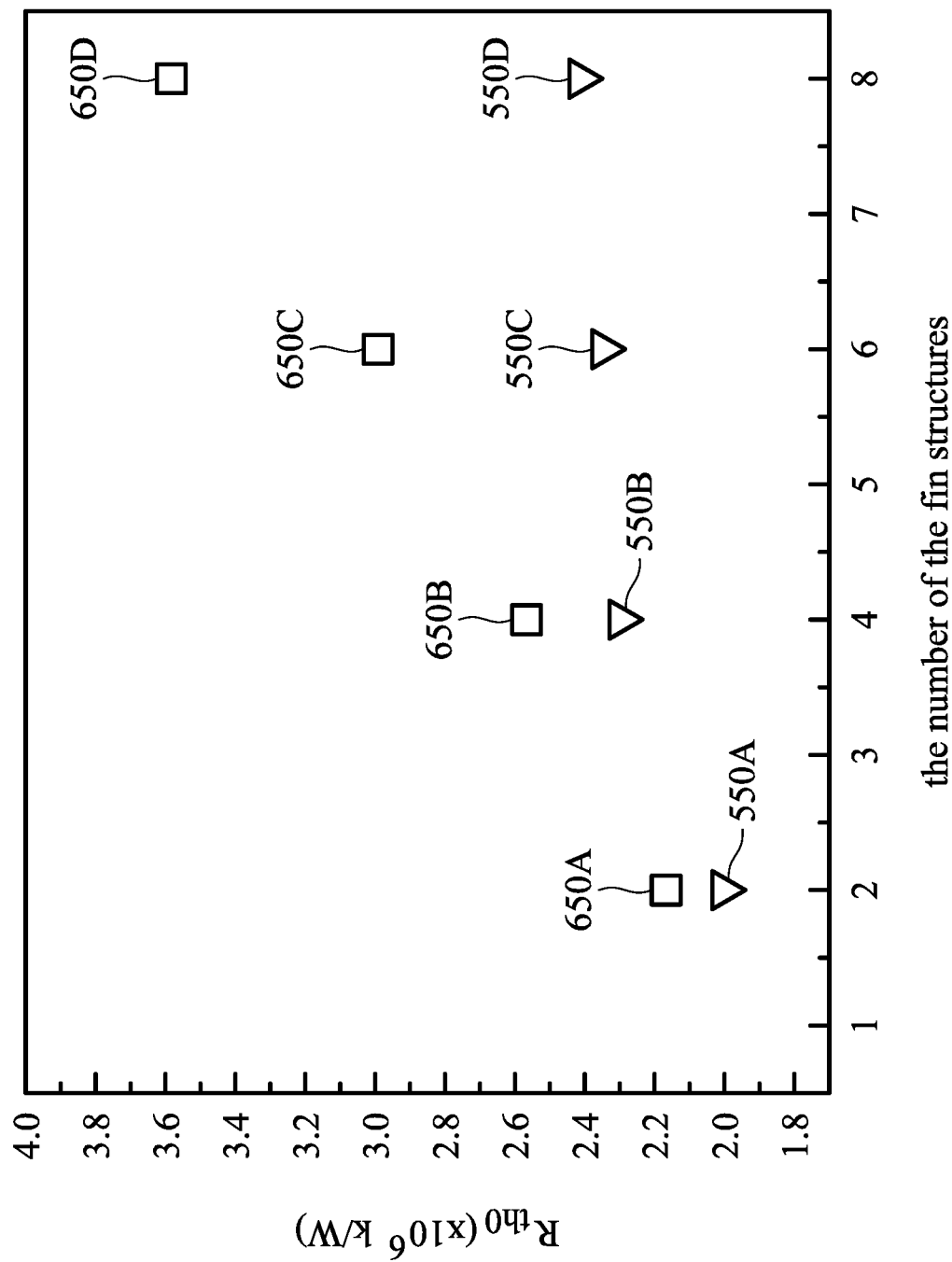
FIG. 4 is a diagram illustrating the relationship between the thermal resistance values and the amount of fin structures of the semiconductor devices in accordance with some embodiments of the disclosure shown in FIGS. 2A-2D and the semiconductor device in accordance with the some comparable examples shown in FIGS. 3A-3D.

As shown in FIG. 3A, the semiconductor device 600A in accordance with some comparable examples is a multi-channel FinFET device having two fin structures 604-1 and 604-2. The semiconductor device 600A includes a single drain via structure 650A1 on a drain portion 620 of the fin structure 604-1. The semiconductor device 600A includes a single source via structure 652A1 on a source portion 622 of the fin structure 604-2. In addition, the semiconductor device 600A includes one gate via structure 654 on a gate structure 630A.

Figure 3B:
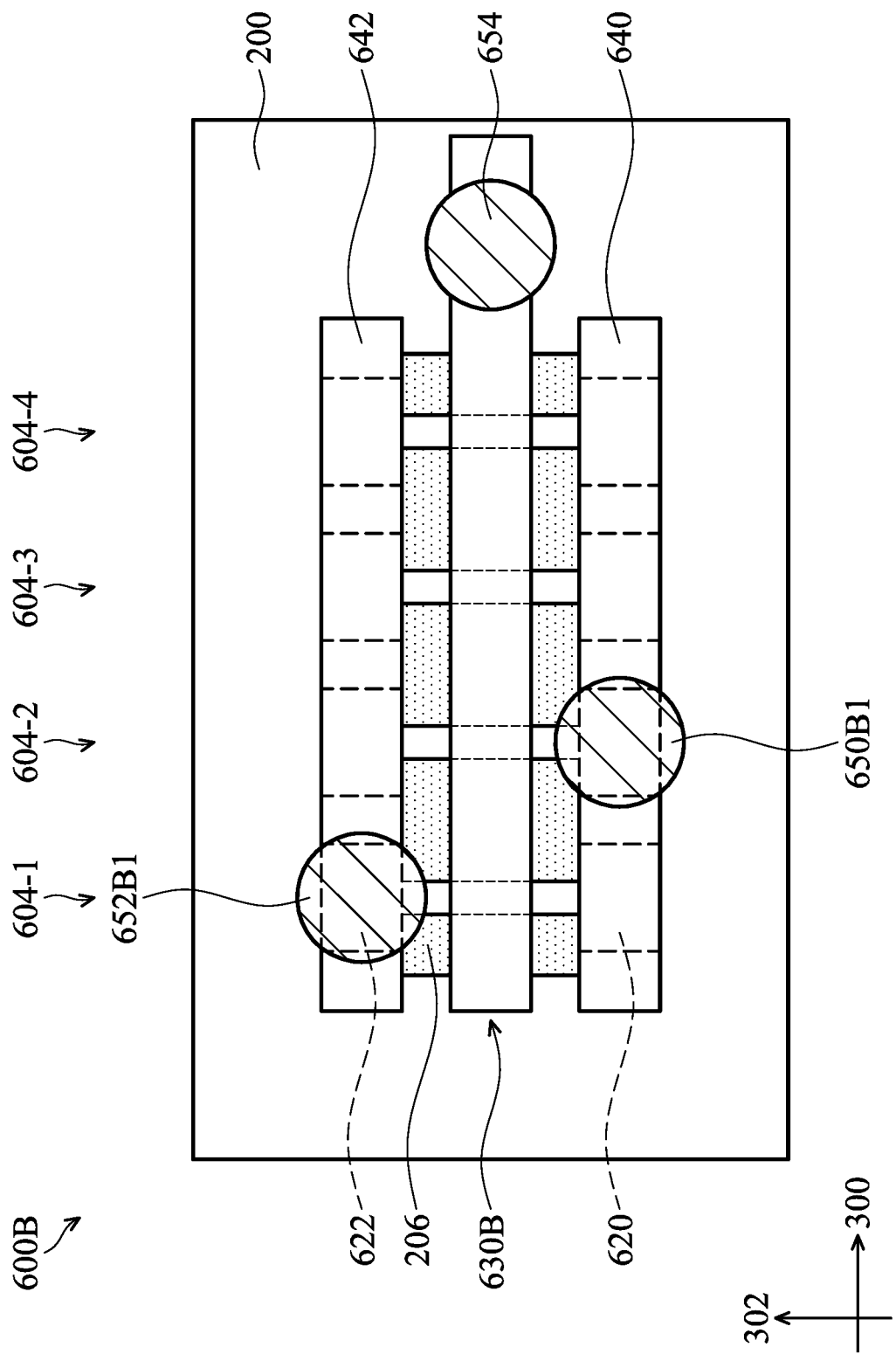

As shown in FIG. 3B, the semiconductor device 600B in accordance with some comparable examples is a multi-channel FinFET device having four fin structures 604-1, 604-2, 604-3 and 604-4. The semiconductor device 600B includes a single drain via structure 650B1 on a drain portion 620 of the fin structure 604-2. The semiconductor device 600B includes a single source via structure 652B1 on respectively on a source portion 622 of the fin structure 604-1. In addition, the semiconductor device 600B includes one gate via structure 654 on a gate structure 630B.

Figure 3C:
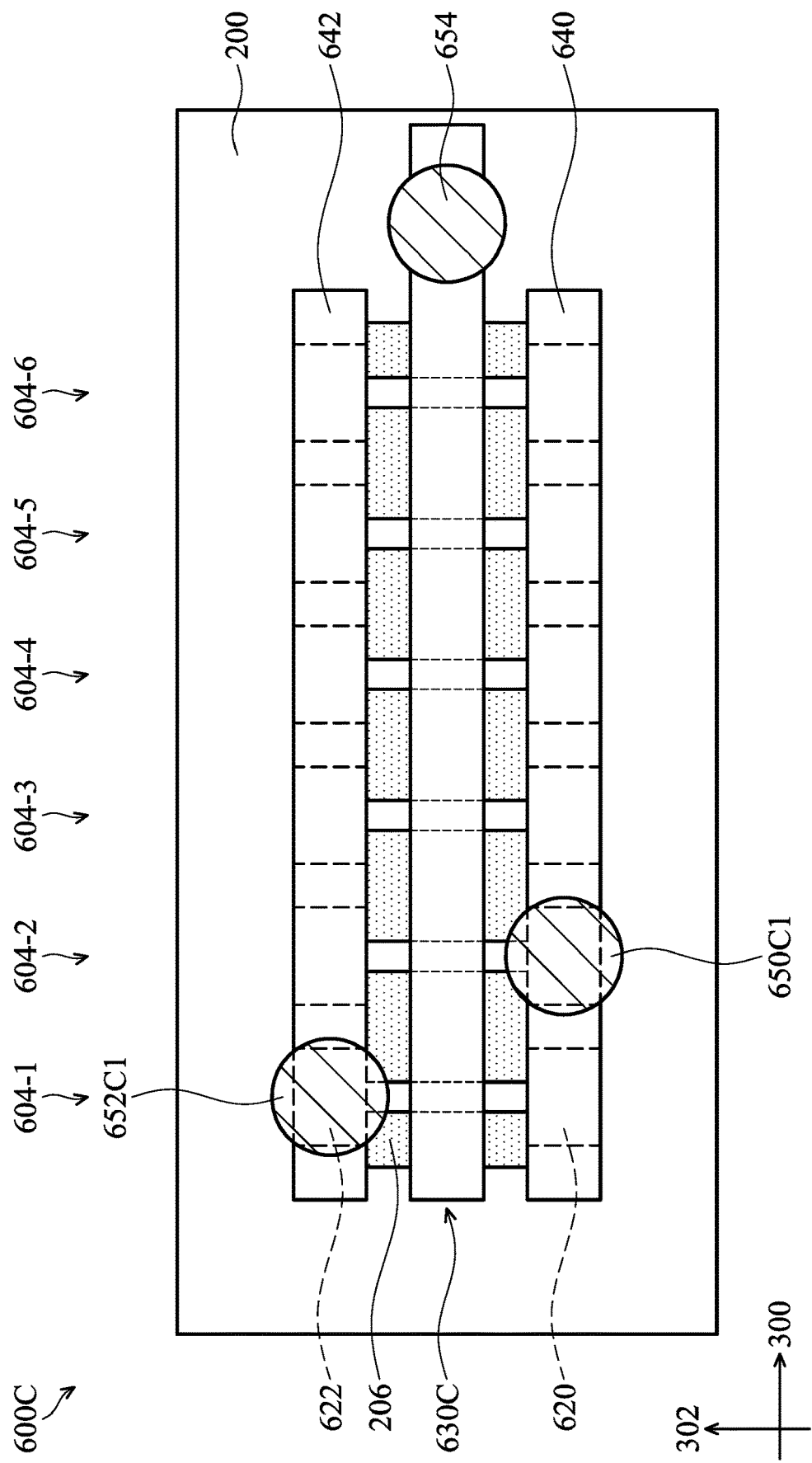

As shown in FIG. 3C, the semiconductor device 600C in accordance with some comparable examples is a multi-channel FinFET device having six fin structures 604-1, 604-2, 604-3, 604-4, 604-5 and 604-6. The semiconductor device 600B includes a single drain via structure 650C1 on a drain portion 620 of the fin structure 604-2. The semiconductor device 500B includes t a single source via structure 652C1 on a source portion 622 of the fin structure 604-1. In addition, the semiconductor device 600C includes one gate via structure 654 on a gate structure 630C.

Figure 3D:
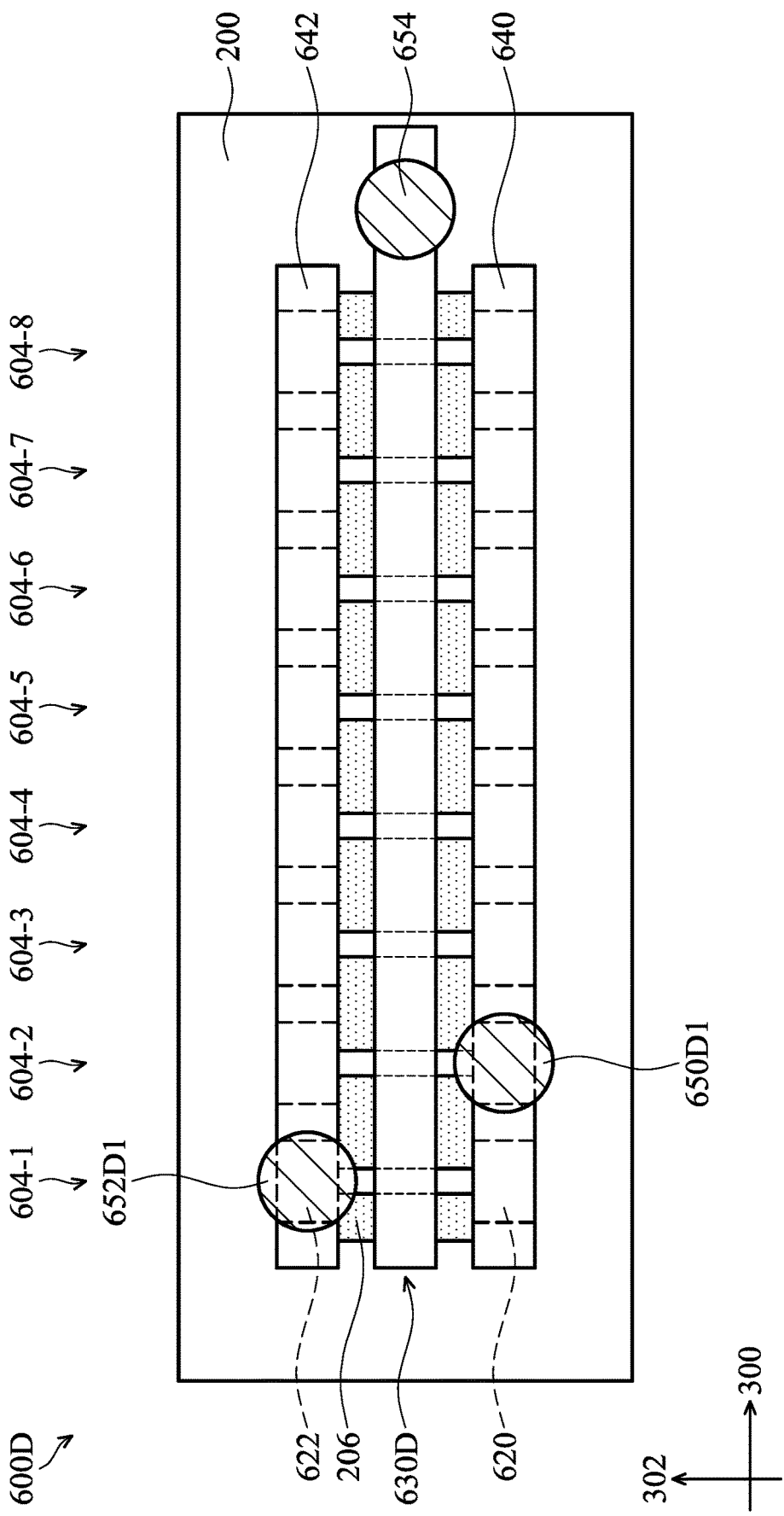

As shown in FIG. 3D, the semiconductor device 600D in accordance with some comparable examples is a multi-channel FinFET device having eight fin structures 604-1, 604-2, 604-3, 604-4, 604-5, 604-6, 604-7 and 604-8. The semiconductor device 600D includes a single drain via structure 650D1 on a drain portion 620 of the fin structure 604-2. The semiconductor device 600D includes a single source via structure 652D1 on a source portion 622 of the fin structures 604-1. In addition, the semiconductor device 600D includes one gate via structure 654 on a gate structure 630D.

FIG. 4 illustrates the comparison result between the thermal resistance ($R_{th0}$) of the semiconductor devices 500A-500D shown in FIGS. 2A-2D and the amount of fin structures, and thermal resistance ($R_{th0}$) of the semiconductor devices 600A-600D shown in FIGS. 3A-3D and the amount of fin structures. In FIG. 4, the points 550A, 550B, 550C and 550D respectively show thermal resistance ($R_{th0}$) of the semiconductor device 500A having two fin structures, the semiconductor device 500B having four fin structures, the semiconductor device 500C having six fin structures and the semiconductor device 500D having eight fin structures in accordance with some embodiments of the disclosure. In addition, the points 650A, 650B, 650C and 650D shown in FIG. 4 respectively show thermal resistance ($R_{th0}$) of the semiconductor device 600A having two fin structures, the semiconductor device 600B having four fin structures, the semiconductor device 600C having six fin structures and the semiconductor device 600D having eight fin structures in accordance with some comparable examples.

As shown in FIG. 4, the points 650A, 650B, 650C and 650D show that when a single drain via structure and a single source via structure are arranged in the multi-channel FinFET device, such as the semiconductor devices 600A-600D of the comparable examples, the thermal resistance values of the multi-channel FinFET devices of the comparable examples increase substantially proportional to the amount of fin structures.

As shown in FIG. 4 the points 550A, 550B, 550C and 550D show that when multi-drain via structures and multi-source via structures are arranged in the multi-channel FinFET device, such as the semiconductor devices 500A-500D in some embodiments, the thermal resistance of the multi-channel FinFET device approaches a saturation value when the amount of fin structures is increased. Compared to the thermal resistance values of the semiconductor devices 600A-600D of the comparable examples (the points 650A, 650B, 650C and 650D), the semiconductor devices 500A-500D show the lower thermal resistance values by arranging additional (dummy) drain via structures on a single drain contact structure and additional (dummy) source via structures on a single source contact structure of the multi-channel FinFET device. In addition, the additional (dummy) drain via structures are positioned beside the drain via structure, and the additional (dummy) source via structures are positioned beside the source via structure.

In some embodiments, the semiconductor device, for example, a multi-channel FinFET device includes a drain via structure electrically connected to the drain contact structure 240 and a source via structure electrically connected to the source contact structure 242. In addition, the semiconductor device may include at least one drain dummy via structure and/or source dummy via structure arranged to improve the thermal dissipation ability of the multi-channel FinFET device. In some embodiments, the drain dummy via structure is the same as/similar to the drain via structure, and the source dummy via structure is the same as/similar to the source via structure. In addition, the drain dummy via structures are positioned beside the drain via structure, and the source dummy via structures are positioned beside the source via structure.

Figure 6:
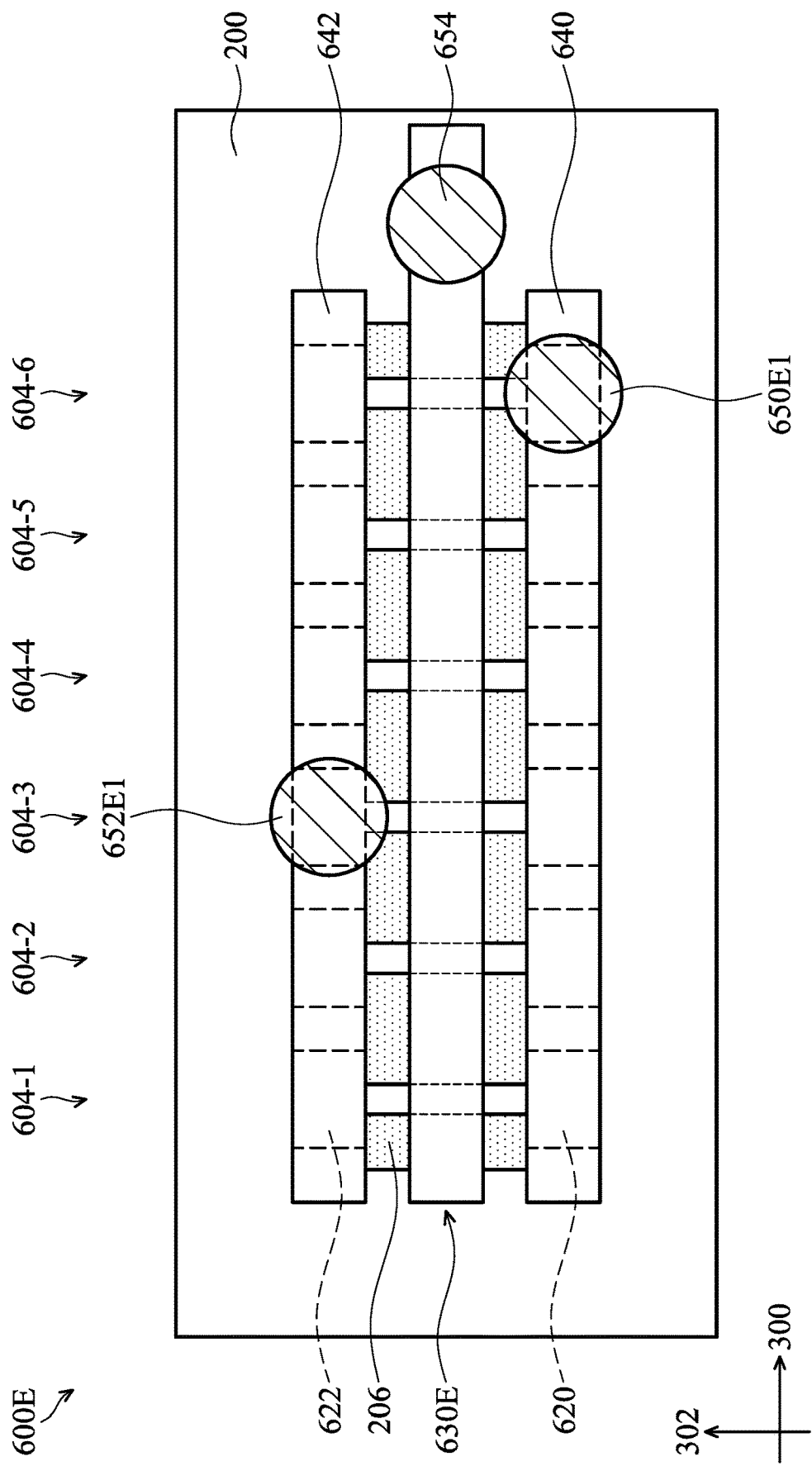
FIG. 6 is a top view of a semiconductor device in accordance with some comparable examples.
Figure 7:
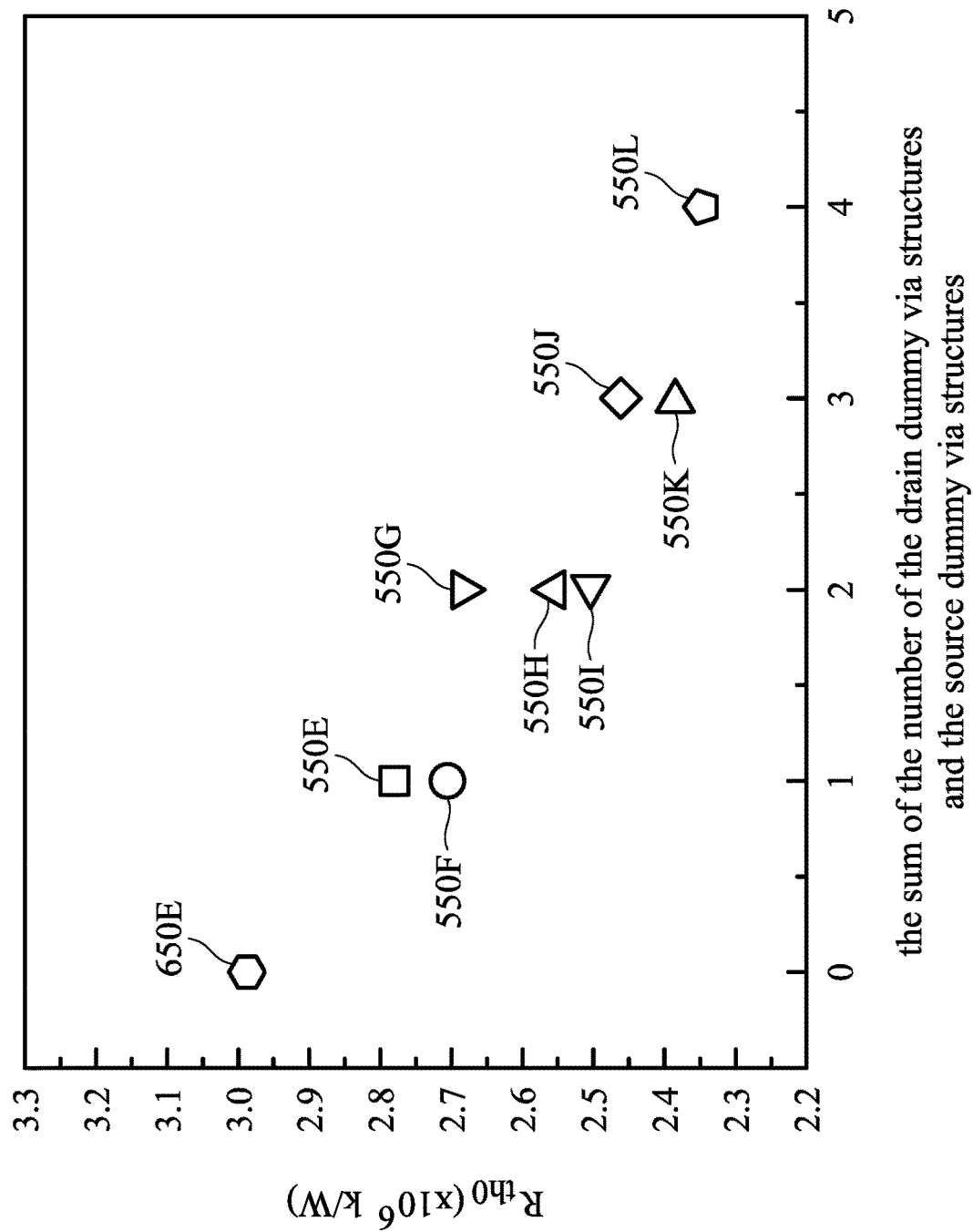
FIG. 7 is a diagram illustrating the relationship between the thermal resistance values and the amount of dummy via structures of the semiconductor devices in accordance with some embodiments of the disclosure shown in FIGS. 5A-5H and the semiconductor device in accordance with some comparable examples shown in FIG. 6.

FIGS. 5A-5H are top views of semiconductor devices 500E-500L in accordance with some embodiments of the disclosure. FIG. 6 is a top view of a semiconductor device 600E in accordance with some comparable examples. FIG. 7 is a diagram showing the simulation result of thermal resistance ($R_{th0}$) of the semiconductor devices 500E-500L shown in FIGS. 5A-5H and thermal resistance (Rth0) of the semiconductor devices 600E shown in FIG. 6. The simulation result is obtained based on the parameters of the semiconductor devices 500E-500L and 600E, for example, CPP (the distance between the drain via structure/source via structure and the gate electrode layer (i.e. contact-gate pitch))=70 nm, Fin Pitch (the pitch (P) of the fin structure)=42 nm, Lg (the length (along the direction 302) of the gate electrode layer)=22 nm, Fin Height (the height of the fin structure)=40 nm, Fin Width (the width (along the direction 300) of the fin structure)=8 nm (top)/10 nm (bottom), and via diameter (the diameter of the drain via structure/source via structure)=32 nm. In addition, FIG. 7 is a diagram illustrating the relationship between the thermal resistance values and the amount of fin structures of the semiconductor devices 500E-500L in accordance with some embodiments of the disclosure shown in FIGS. 5A-5H and the semiconductor device 600E in accordance with some comparable examples shown in FIG. 6.

In some embodiments, the semiconductor devices 500E-500L are multi-channel FinFET devices having six fin structures 204-1, 204-2, 204-3, 204-4, 204-5 and 204-6. In some embodiments, each of the semiconductor devices 500E-500L includes a drain via structure electrically connected to the drain contact structure 240 and a source via structure electrically connected to the source contact structure 242. In addition, each of the semiconductor devices 500E-500L may include at least one drain dummy via structure and/or source dummy via structure to improve the thermal dissipation ability of the multi-channel FinFET device.

Figure 5A:
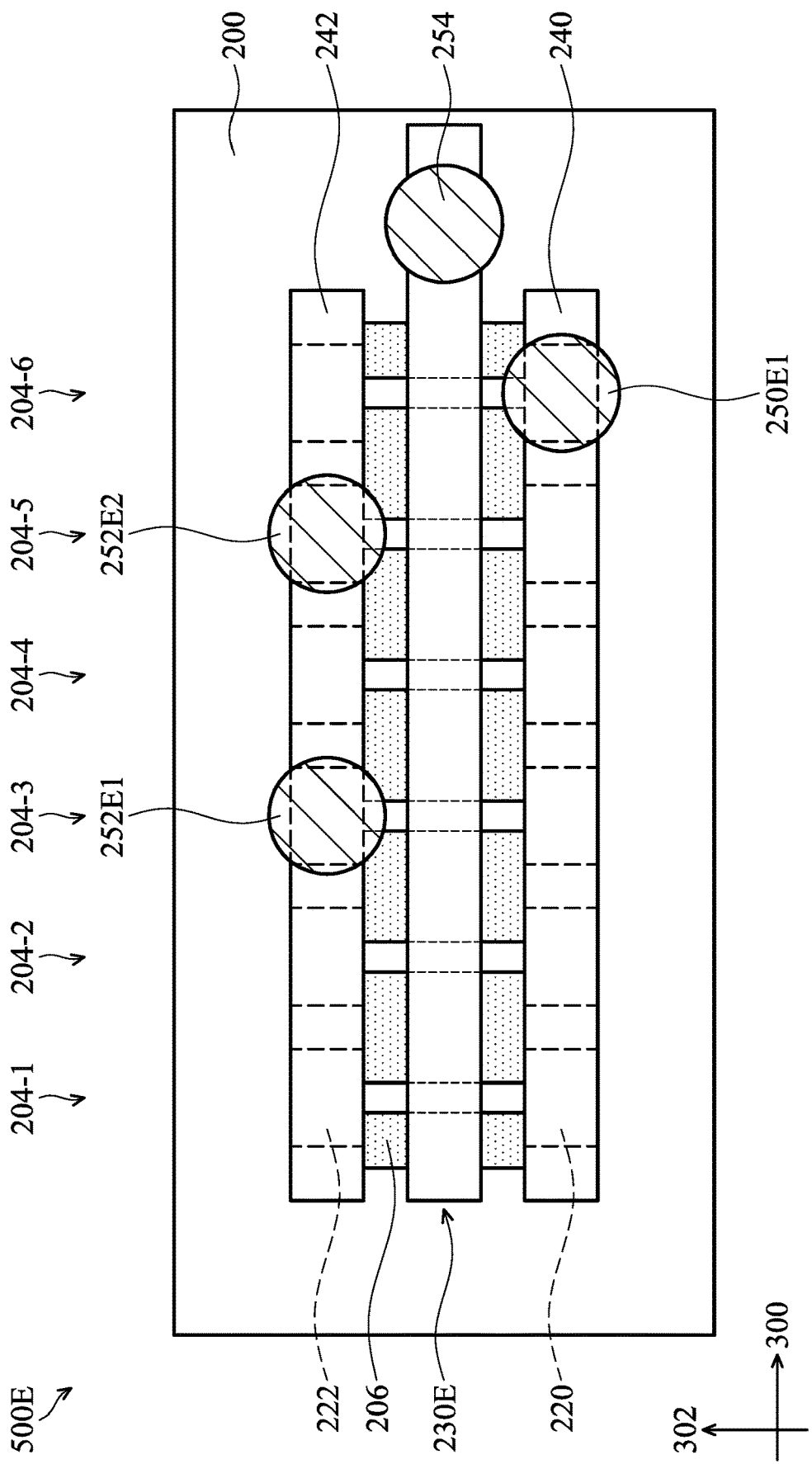
FIGS. 5A-5H are top views of an semiconductor device in accordance with some embodiments of the disclosure.

As shown in FIG. 5A, the semiconductor device 500E includes a drain via structure 250E1 on the drain portion 220 of the fin structures 204-6 and a source via structure 252E1 on the source portion 222 of the fin structure 204-3. The semiconductor device 500E further includes and a source dummy via structure 252E2 beside the source via structure 252E1 and on the source portion 222 of the fin structure 204-5. In addition, the semiconductor device 500E includes a single gate via structure 254 on a gate structure 230E.

Figure 5B:
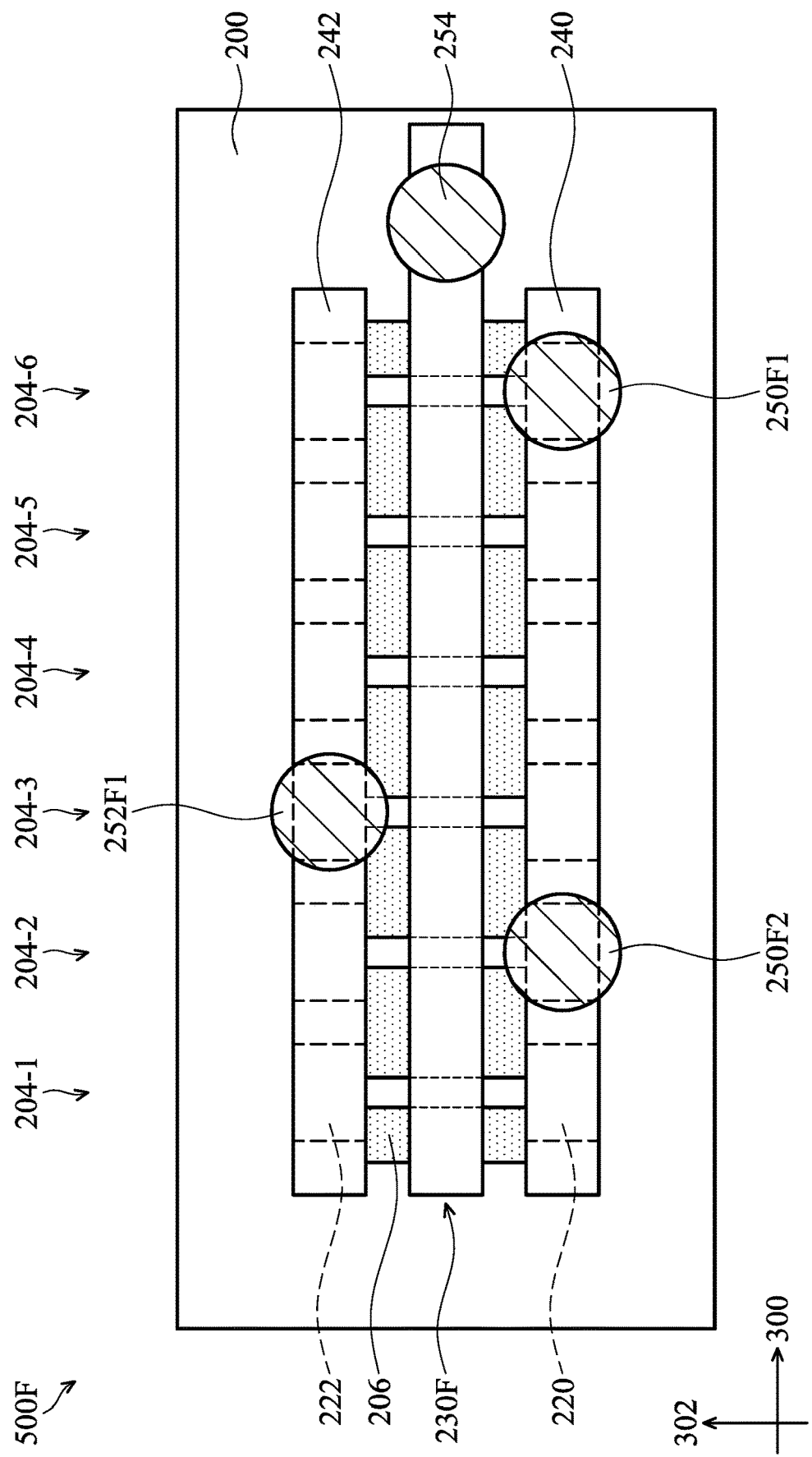

As shown in FIG. 5B, the semiconductor device 500F includes a drain via structure 250F1 on the drain portion 220 of the fin structures 204-6 and a source via structure 252F1 on the source portion 222 of the fin structure 204-3. The semiconductor device 500F further includes and a drain dummy via structure 250F2 beside the drain via structure 250F1 and on the drain portion 220 of the fin structure 204-2. In addition, the semiconductor device 500F includes a single gate via structure 254 on a gate structure 230F.

Figure 5C:
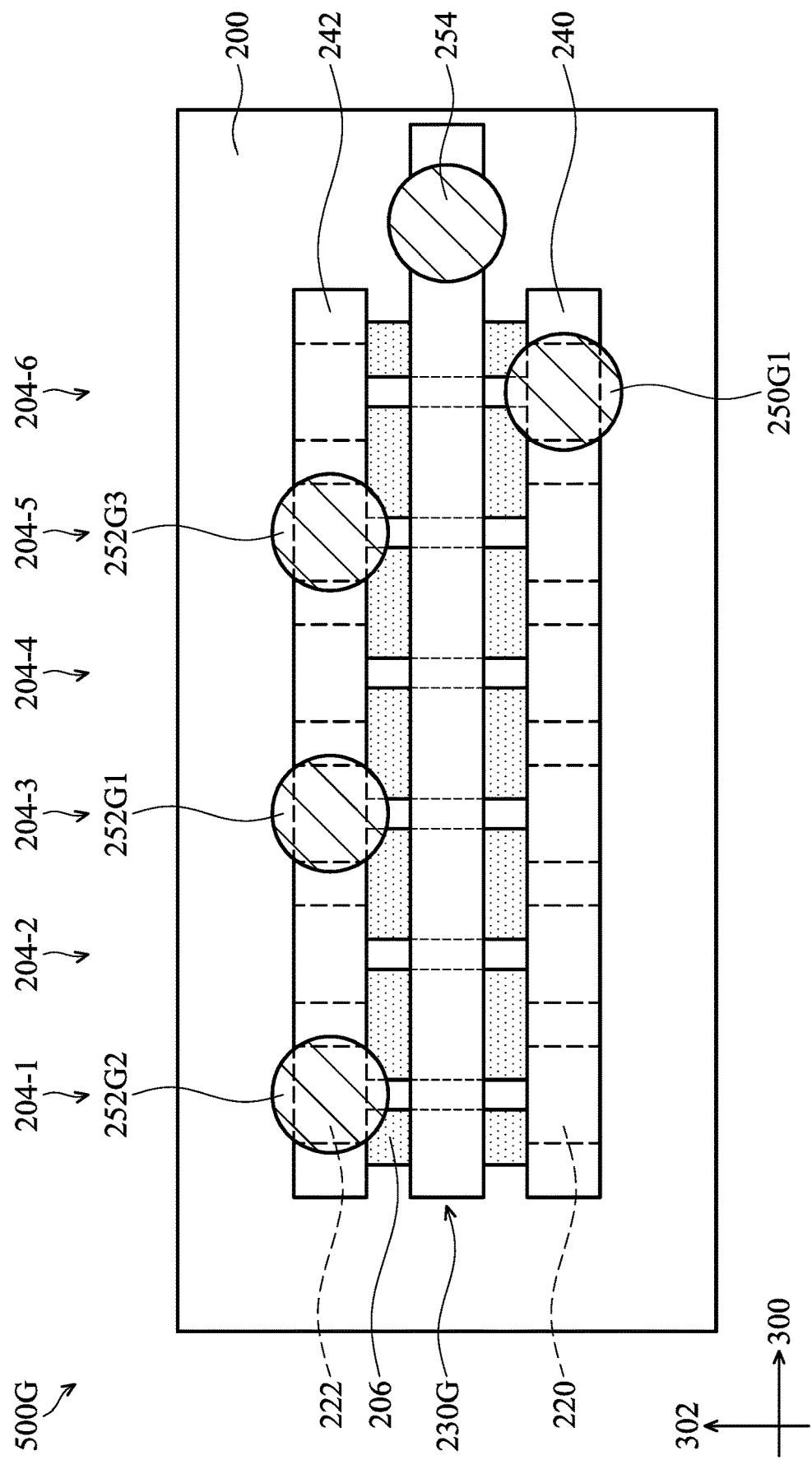

As shown in FIG. 5C, the semiconductor device 500G includes a drain via structure 250G1 on the drain portion 220 of the fin structures 204-6 and a source via structure 252G1 on the source portion 222 of the fin structure 204-3. The semiconductor device 500E further includes two source dummy via structures 252G2 and 252G3 beside the drain via structure 250G1 and respectively on the source portions 222 of the fin structures 204-1 and 204-5. In addition, the semiconductor device 500G includes a single gate via structure 254 on a gate structure 230G.

Figure 5D:
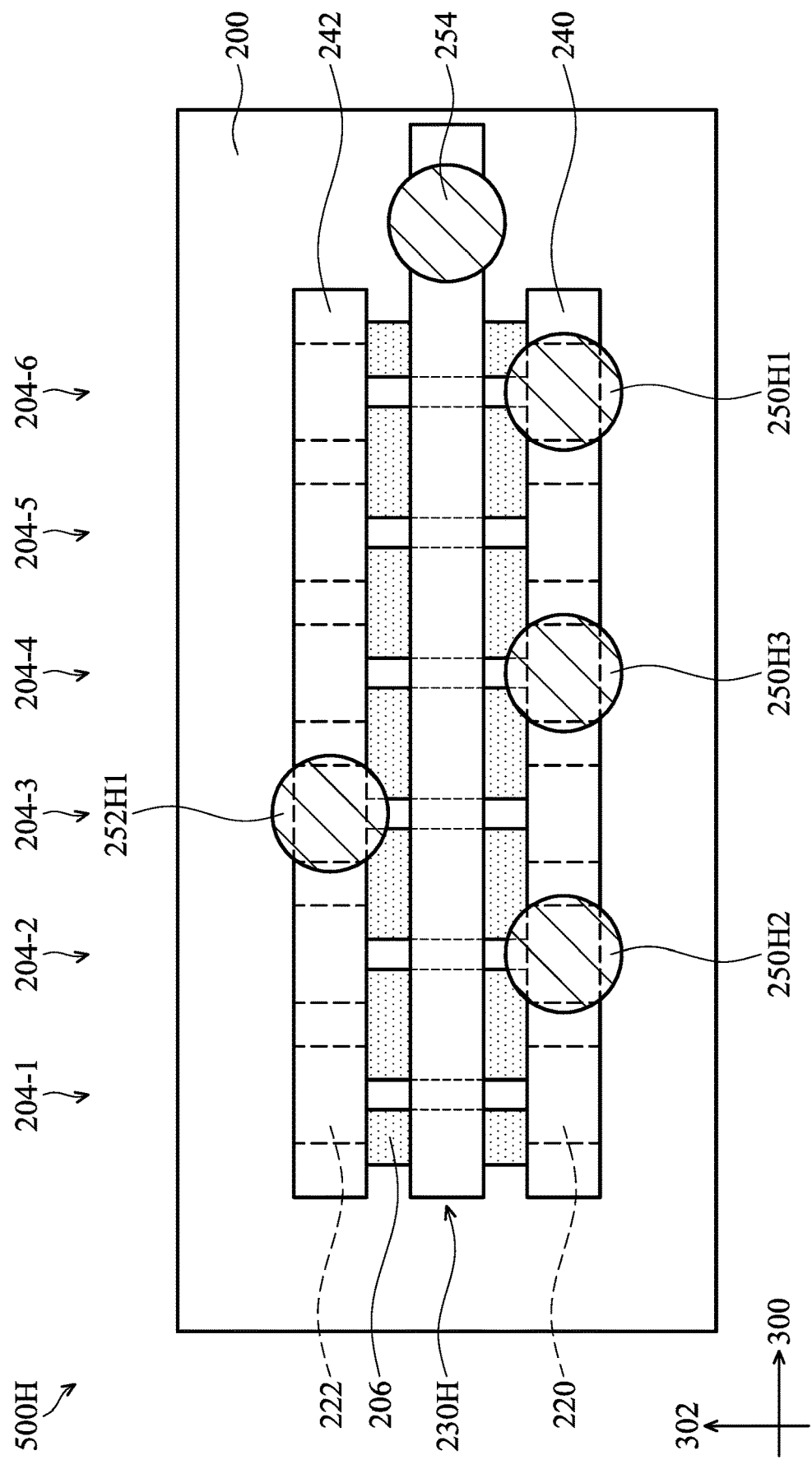

As shown in FIG. 5D, the semiconductor device 500H includes a drain via structure 250H1 on the drain portion 220 of the fin structures 204-6 and a source via structure 252H1 on the source portion 222 of the fin structure 204-3. The semiconductor device 500H further includes two drain via structures 250H2 and 250H3 beside the drain via structure 250H1 and respectively on the drain portions 220 of the fin structures 204-2 and 204-4. In addition, the semiconductor device 500H includes a single gate via structure 254 on a gate structure 230H.

Figure 5E:
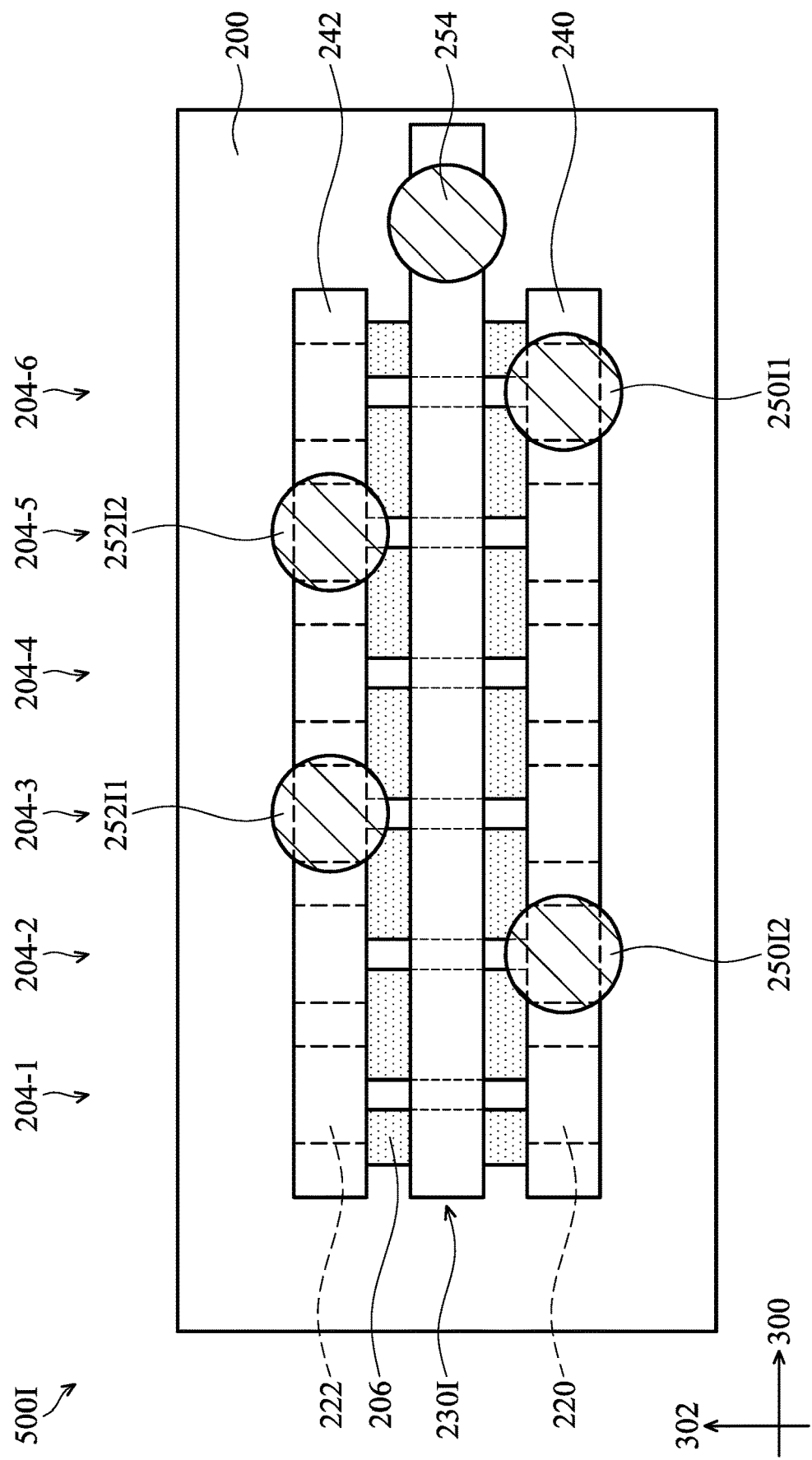

As shown in FIG. 5E, the semiconductor device 500I includes a drain via structure 250I1 on the drain portion 220 of the fin structures 204-6 and a source via structure 252I1 on the source portion 222 of the fin structure 204-3. The semiconductor device 500I further includes a drain dummy via structures 250I2 beside the drain via structure 250I1 and on the drain portions 220 of the fin structure 204-2. The semiconductor device 500I further includes a source dummy via structure 252I2 beside the source via structure 252I1 and on the source portion 222 of the fin structure 204-5. In addition, the semiconductor device 500I includes a single gate via structure 254 on a gate structure 230I.

Figure 5F:
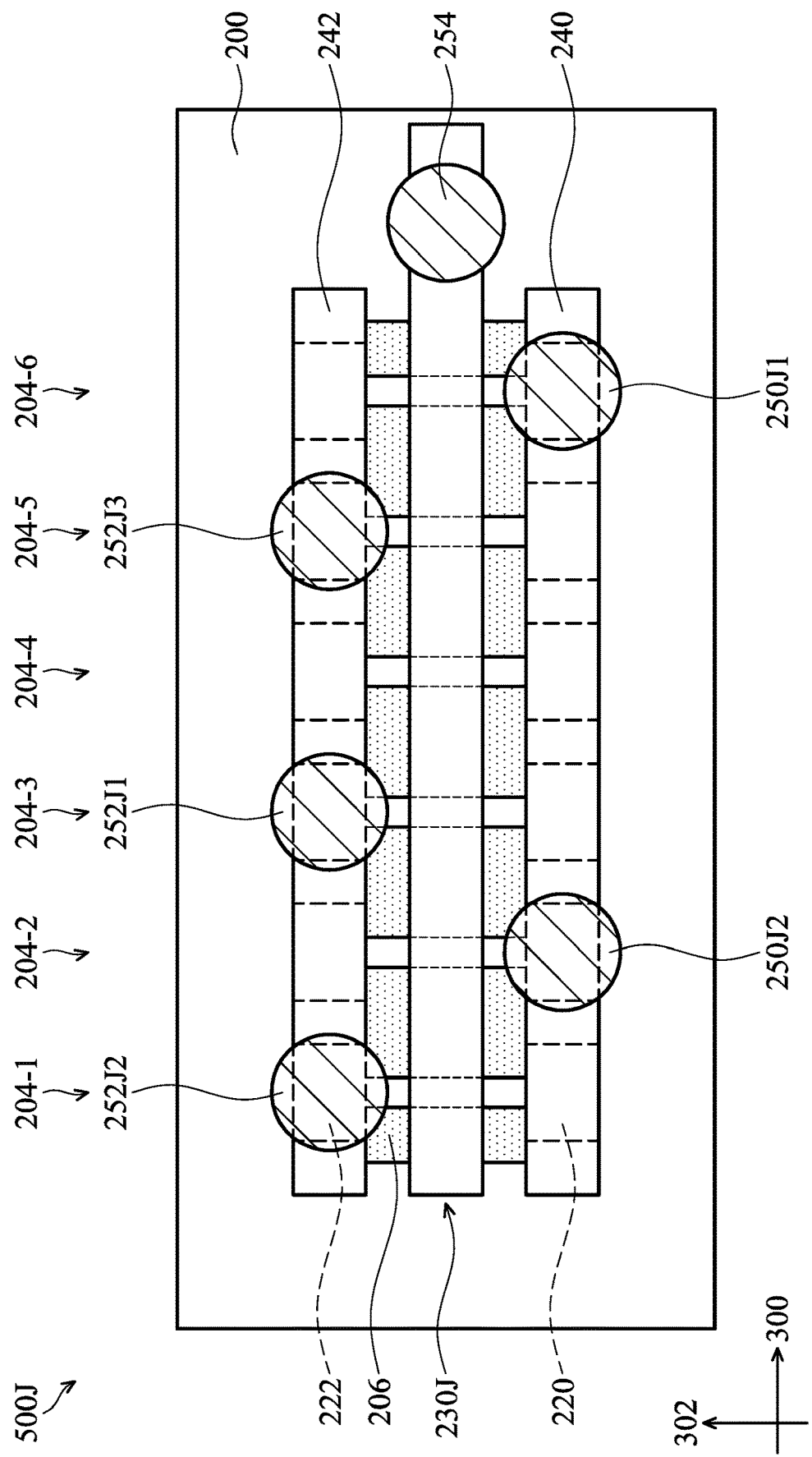

As shown in FIG. 5F, the semiconductor device 500J includes a drain via structure 250J1 on the drain portion 220 of the fin structures 204-6 and a source via structure 252J1 on the source portion 222 of the fin structure 204-3. The semiconductor device 500J further includes and a drain dummy via structure 250J2 beside the drain via structure 250J1 and on the drain portion 220 of the fin structure 204-2. The semiconductor device 500J further includes two source dummy via structures 252J2 and 252J3 beside the drain via structure 250J1 and respectively on the source portions 222 of the fin structures 204-1 and 204-5. In addition, the semiconductor device 500J includes a single gate via structure 254 on a gate structure 230J.

Figure 5G:
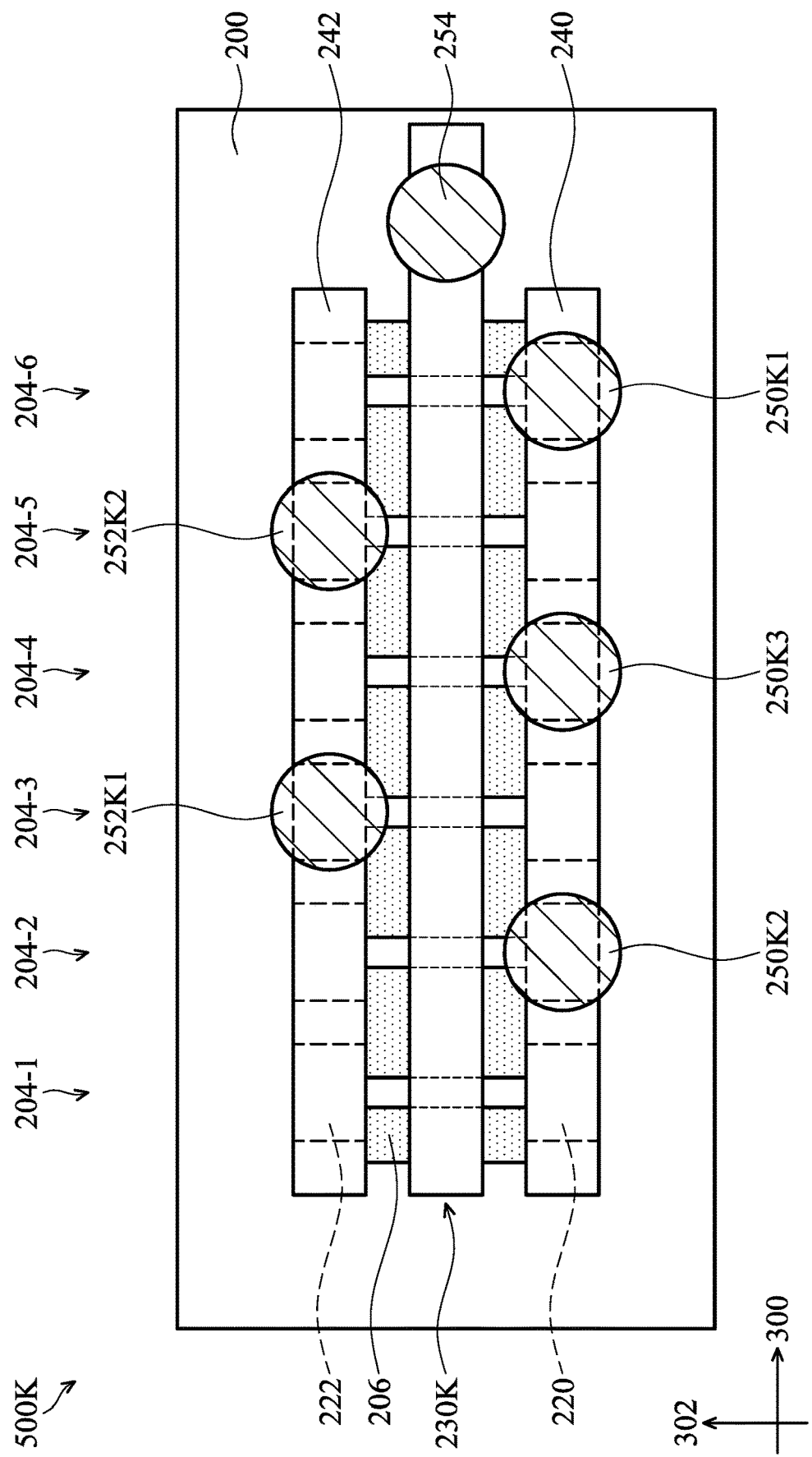

As shown in FIG. 5G, the semiconductor device 500K includes a drain via structure 250K1 on the drain portion 220 of the fin structures 204-6 and a source via structure 252K1 on the source portion 222 of the fin structure 204-3. The semiconductor device 500K further includes two drain via structures 250K2 and 250K3 beside the drain via structure 250K1 and respectively on the drain portions 220 of the fin structures 204-2 and 204-4. The semiconductor device 500K further includes a source dummy via structure 252K2 beside the source via structure 252K1 and on the source portion 222 of the fin structure 204-5. In addition, the semiconductor device 500K includes a single gate via structure 254 on a gate structure 230K.

Figure 5H:
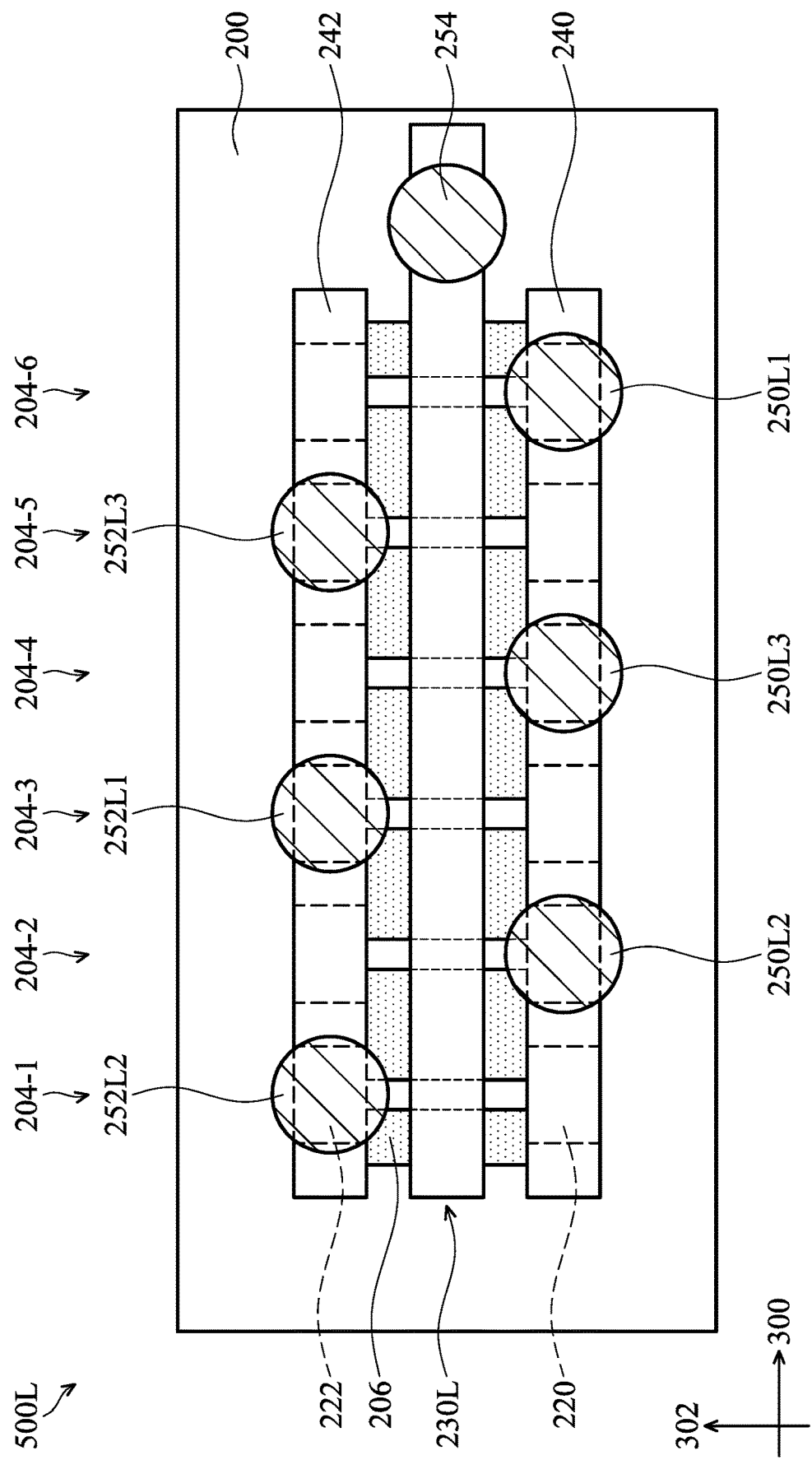

As shown in FIG. 5H, the semiconductor device 500L includes a drain via structure 250L1 on the drain portion 220 of the fin structures 204-6 and a source via structure 252L1 on the source portion 222 of the fin structure 204-3. The semiconductor device 500L further includes two drain dummy via structures 250L2 and 250L3 beside the drain via structure 250L1 and respectively on the drain portions 220 of the fin structures 204-2 and 204-4. The semiconductor device 500L further includes two source dummy via structures 252L2 and 252L3 beside the source via structure 252L1 and respectively on the source portions 222 of the fin structures 204-1 and 204-5. In addition, the semiconductor device 500L includes a single gate via structure 254 on a gate structure 230L.

In some embodiments, the semiconductor devices 500E-500L are designed to have the following arrangements, the sum of the amount of drain dummy via structures and the source dummy via structures of the semiconductor device is greater than 1. In addition, the amount of drain via structures and/or the amount of source via structures of the semiconductor device is less than the amount of fin structures.

FIG. 6 is a top view of a semiconductor device 600E in accordance with some comparable examples. The semiconductor devices 600E has a single drain via structure on the single drain contact structure and a single source via structure on the single source contact structure. Compared with the semiconductor devices 500E-500L, the semiconductor device 600E has a similar structure except that the semiconductor device 600E does not include any drain dummy via structure and/or any source dummy via structure.

In some embodiments, the arrangements of the drain via structures (including the drain dummy via structures) and the source via structures (including the source dummy via structures) of the semiconductor devices 500E-500L set to meet the arrangements of the drain via structures and the source via structures of the semiconductor device 500.

As shown in FIG. 6, the semiconductor device 600E in accordance with some comparable examples is a multi-channel FinFET device having six fin structures 604-1, 604-2, 604-3, 604-4, 604-5 and 604-6. The semiconductor device 600E includes a single drain via structure 650E1 on a drain portion 620 of the fin structure 604-6. The semiconductor device 600E includes a single source via structure 652E1 on a source portion 622 of the fin structure 604-3. In addition, the semiconductor device 600C includes one gate via structure 654 on a gate structure 630E.

FIG. 7 illustrates the comparison result between the thermal resistance values and the amount of dummy via structures of the semiconductor devices 500E-500L shown in FIGS. 5A-5H and the semiconductor device 600E shown in FIG. 6. In FIG. 7, the points 550E-550L respectively show the thermal resistance values ($R_{th0}$) of the semiconductor devices 500E-500L having six fin structures in accordance with some embodiments of the disclosure. In addition, the point 650E shown in FIG. 7 shows the thermal resistance values ($R_{th0}$) of the semiconductor device 600E having six fin structures in accordance with some comparable examples.

As shown in FIG. 7, the point 650E shows that the thermal resistance values ($R_{th0}$) of the semiconductor device 600E, which is arranged a single drain via structure on the single drain contact structure and a single source via structure on the single source contact structure, in accordance with some comparable examples is about 3.0 K/μW.

As shown in FIG. 7, from the comparison between the points 550E-550L and the point 650, the semiconductor devices 500E-500L, which have at least one drain dummy via structure and/or at least one source dummy via structure, have the lower thermal resistance values ($R_{th0}$) than the semiconductor device 600E, which has a single drain via structure and a single source via structure.

In addition, from the result of the points 550E-550L shown in FIG. 7, it should be noted that among the semiconductor devices 500E-500L, when the sum of the amount of drain dummy via structures and the source dummy via structures of the semiconductor device is an odd number, the semiconductor device having the greater amount of drain dummy via structures may show a lower thermal resistance value. For example, the sum of the amount of drain dummy via structures and the source dummy via structures of the semiconductor devices 500E-500F are each equal to 1. The amount of drain dummy via structures of the semiconductor device 500E is equal to 0, and the amount of source dummy via structures of the semiconductor device 500E is equal to 1. In addition, the amount of drain dummy via structures of the semiconductor device 500F is equal to 1, and the amount of source dummy via structures of the semiconductor device 500F is equal to 0. Compared with the semiconductor device 500E (the point 550E), the semiconductor device 500F (the point 550F) having the greater amount of drain dummy via structures shows a lower thermal resistance value ($R_{th0}$), while the amount of the fin structure and the sum of the amount of drain dummy via structures and source dummy via structures of the semiconductor devices 500E-500F are kept at the same value. For example, the sum of the amount of drain dummy via structures and source dummy via structures of the semiconductor devices 500E-500F are each equal to 3. The amount of drain dummy via structures of the semiconductor device 500J is equal to 1, and the amount of source dummy via structures of the semiconductor device 500J is equal to 2. In addition, the amount of drain dummy via structures of the semiconductor device 500K is equal to 2, and the amount of source dummy via structures of the semiconductor device 500F is equal to 1. Compared with the semiconductor device 500J (the point 550J), the semiconductor device 500K (the point 550K) having the greater amount of drain dummy via structures shows a lower thermal resistance value ($R_{th0}$) while the amount of the fin structure and the sum of the amount of drain dummy via structures and the source dummy via structures of the semiconductor devices 500J-500K are kept at the same value.

In some embodiments, the semiconductor device may be designed to have the following arrangements, when the sum of the amount of drain dummy via structures and the source dummy via structures of the semiconductor device is an odd number and represented as (2N−1), the amount of drain dummy via structures is equal to N and the amount of source dummy via structures is equal to (N−1), where N is a positive integer.

Similarly, the semiconductor device may be designed to have the following arrangements, when the sum of the amount of drain via structures, the amount of drain dummy via structures, the amount of source via structures and the amount of source dummy via structures of the semiconductor device is an odd number and represented as (2N+1), the sum of the amount of drain via structures and the amount of drain dummy via structures are equal to (N+1) and the sum of the amount of source via structures and the amount of source dummy via structures are equal to N, where N is a positive integer.

In some embodiments, an overlapping area between the drain via structure and the drain contact structure 240 or the drain dummy via structure and the drain contact structure 240 is substantially equal to the drain region 220 of the semiconductor devices 500E-500L. In addition, an overlapping area between the source via structure and the source contact structure 242 or the source dummy via structure and the source contact structure 242 is substantially equal to the source region 222 of the semiconductor devices 500E-500L. Therefore, the semiconductor device may be designed to have the following arrangements, when the sum of the amount of via structures, which includes the drain via structures, the drain dummy via structures, the source via structures and the source dummy via structures, of the semiconductor device is an odd number, the sum of overlapping areas between the drain via structure and the drain contact structure 240 and between the drain dummy via structure and the drain contact structure 240 are greater than the sum of overlapping areas between the source via structure and the source contact structure 242 and between the source dummy via structure and the source contact structure 242.

Furthermore, from the result of the points 550E-550L shown in FIG. 7, it should be noted that among the semiconductor devices 500E-500L, when the sum of the amount of drain dummy via structures and the source dummy via structures of the semiconductor device is an even number, the semiconductor device having an equal amount of drain dummy via structures and source dummy via structures may show a lower thermal resistance value. For example, the sum of the amount of drain dummy via structures and the source dummy via structures of the semiconductor devices 500G-500I are respectively equal to 2. The amount of drain dummy via structures of the semiconductor device 500G is equal to 0, and the amount of source dummy via structures of the semiconductor device 500G is equal to 2. In addition, the amount of drain dummy via structures of the semiconductor device 500H is equal to 2, and the amount of source dummy via structures of the semiconductor device 500H is equal to 0. Furthermore, the amount of drain dummy via structures of the semiconductor device 500I is equal to 1, and the amount of source dummy via structures of the semiconductor device 500I is equal to 1. Compared with the semiconductor device 500G (the point 550G) and the semiconductor device 500H (the point 550H), the semiconductor device 500I (the point 550I) having an equal amount of drain dummy via structures and source dummy via structures shows a lower thermal resistance value ($R_{th0}$) while the numbers of the fin structure of the semiconductor devices 500G-500I are kept at the same value.

Therefore, the semiconductor device may be designed to have the following arrangements, when the sum of the amount of drain dummy via structures and the amount of source dummy via structures of the semiconductor device is an even number and represented as 2N, the sum of the amount of drain dummy via structures and the source dummy via structures of the semiconductor device are respectively equal to N, where N is a positive integer.

Similarly, the semiconductor device may be designed to have the following arrangements, when the sum of the amount of drain via structures, the amount of drain dummy via structures, the amount of source via structures and the amount of source dummy via structures of the semiconductor device is an even number and represented as (2N+2), the sum of the amount of drain via structures and the amount of drain dummy via structures of the semiconductor device is equal to (N+1), and the sum of the amount of source via structures and the amount of source dummy via structures of the semiconductor device is equal to (N+1), where N is a positive integer.

Furthermore, the semiconductor device may be designed to have the following arrangements, when the sum of the amount of via structures, which includes the drain via structures, the drain dummy via structures, the source via structures and the source dummy via structures, of the semiconductor device is an even number, the sum of overlapping areas between the drain via structure and the drain contact structure 240 and between the drain dummy via structure and the drain contact structure 240 is equal to the sum of overlapping areas between the source via structure and the source contact structure 242 and between the source dummy via structure and the source contact structure 242.

Embodiments provide a semiconductor device, for example, a multi-channel fin field-effect transistor (finFET) device. The semiconductor device includes fin structures arranged in parallel, drain portions of the fin structures are electrically connected through a single drain contact structure and source portions of the fin structures are electrically connected through a single source contact structure. The semiconductor device further includes a drain via structure in contact with the drain single drain contact structure and a source via structure in contact with the single source contact structure. The semiconductor device may be designed to arrange additional (dummy) bottommost via structures on the drain contact structure and/or the source contact structure to improve the thermal dissipation ability. In some embodiments, the sum of the amount of drain dummy via structures and the source dummy via structures of the semiconductor device is greater than 2, and less than or equal to two times the amount of fin structures. In some embodiments, when the sum of the amount of drain dummy via structures and the source dummy via structures of the semiconductor device is an odd number and represented as (2N−1), the amount of drain dummy via structures is equal to N and the amount of source dummy via structures is equal to (N−1), where N is a positive integer. In some embodiments, when the sum of the amount of drain dummy via structures and the amount of source dummy via structures of the semiconductor device is an even number and represented as 2N, the sum of the amount of drain dummy via structures and the source dummy via structures of the semiconductor device are respectively equal to N, where N is a positive integer.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a gate structure over fin structures arranged in parallel, wherein each of the fin structures has a drain portion and a source portion on opposite sides of the gate structure;
   a drain contact structure over the drain portions of the fin structures;
   a source contact structure over the source portions of the fin structures;
   a first amount of drain via structures electrically connected to the drain contact structure, wherein the first amount of drain via structures are respectively disposed overlying the drain portions of parts of the fin structures in one-to-one correspondence, and the source portions of the parts of the fin structures are free from any source via structure; and
   a second amount of source via structures electrically connected to the source contact structure, wherein a sum of the first amount and the second amount is greater than or equal to 2, and the sum of the first amount and the second amount is less than or equal to two times a total amount of the fin structures, wherein the second amount of source via structures are respectively positioned overlying the source portions of remaining parts of the fin structures in one-to-one correspondence, and the drain portions of the remaining parts of the fin structures are free from any drain via structure.

2. The semiconductor device as claimed in claim 1, wherein the sum of the first amount and the second amount is an even number represented as 2N, and the first amount and the second amount are respectively equal to N, where N is a positive integer.

3. The semiconductor device as claimed in claim 1, wherein the sum of the first amount and the second amount is an odd number represented as (2N−1), the first amount is equal to N and the second amount is equal to (N−1), where N is a positive integer.

4. The semiconductor device as claimed in claim 1, wherein a first overlapping area between the first amount of drain via structures and the drain contact structure is less than or equal to a second overlapping area between the second amount of source via structures and the source contact structure.

5. The semiconductor device as claimed in claim 1, wherein the parts of the fin structures number as the first amount.

6. The semiconductor device as claimed in claim 5, wherein the remaining parts of the fin structures number as the second amount.

7. The semiconductor device as claimed in claim 6, wherein the fin structures are periodically arranged in a first direction with a pitch and extending in a second direction, wherein closest two drain via structures are separated from each other by at least two times the pitch.

8. The semiconductor device as claimed in claim 7, wherein closest two source via structures are separated from each other by at least two times the pitch.

9. The semiconductor device as claimed in claim 1, wherein the total amount of the fin structures is greater than the first amount and/or the second amount.

10. The semiconductor device as claimed in claim 1, further comprising:
    a third amount of gate via structures electrically connected to the gate structure, wherein the third amount is less than or equal the first amount and/or the second amount.

11. The semiconductor device as claimed in claim 1, wherein the drain via structures are positioned on and in physical contact with the drain contact structure, and the source via structures are positioned on and in physical contact with the source contact structure.

12. A semiconductor device, comprising:
- a gate structure over fin structures arranged in parallel, wherein each of the fin structures has a drain portion and a source portion on opposite sides of the gate structure;
- a single drain contact structure over the drain portions of the fin structures;
- a single source contact structure over the source portions of the fin structures;
- a first amount of drain via structures in contact with the single drain contact structure, wherein the first amount of drain via structures are respectively disposed overlying the drain portions of parts of the fin structures in one-to-one correspondence, and the source portions of the parts of the fin structures are free from any source via structure; and
- a second amount of source via structures in contact with the single source contact structure, wherein the second amount of source via structures are respectively positioned overlying the source portions of remaining parts of the fin structures in one-to-one correspondence, and the drain portions of the remaining parts of the fin structures are free from any drain via structure,
- wherein a first overlapping area between the first amount of drain via structures and the drain contact structure is less than or equal to a second overlapping area between the second amount of source via structures and the source contact structure.

13. The semiconductor device as claimed in claim 12, wherein a sum of the first amount and the second amount is an even number represented as (2N+2), and the first amount and the second amount are equal to (N+1), where N is a positive integer.

14. The semiconductor device as claimed in claim 12, wherein a sum of the first amount and the second amount is an odd number represented as (2N+1), the first amount is equal to (N+1) and the second amount is equal to N, where N is a positive integer.

15. The semiconductor device as claimed in claim 12, wherein the parts of the fin structures number as the first amount.

16. The semiconductor device as claimed in claim 15, wherein the remaining parts of the fin structures number as the second amount.

17. The semiconductor device as claimed in claim 16, wherein the fin structures are periodically arranged in a first direction with a pitch and extending in a second direction, wherein closest two drain via structures are separated from each other by at least two times the pitch.

18. The semiconductor device as claimed in claim 12, wherein a sum of the first amount and the second amount is greater than or equal to 2, and the sum of the first amount and the second amount is less than or equal to two times a total amount of the fin structures.

* * * * *